United States Patent [19]

Okuda

[11] Patent Number: 5,802,096

[45] Date of Patent: Sep. 1, 1998

[54] DISTRIBUTED FEED BACK LASER WITH A GRATING STRUCTURE ADJUSTED FOR A REDUCED INTERMODULATION DISTORTION IN AN ANALOG AMPLITUDE MODULATION AND METHOD FOR FABRICATING THE SAME

[75] Inventor: Tetsuro Okuda, Tokyo, Japan

[73] Assignee: NEC Corporation, Tokyo, Japan

[21] Appl. No.: 621,946

[22] Filed: Mar. 25, 1996

[30] Foreign Application Priority Data

Mar. 23, 1995 [JP] Japan .................................. 7-064067
Apr. 8, 1995 [JP] Japan .................................. 7-107919

[51] Int. Cl.$^6$ .............................. H01S 3/08; H01S 3/19
[52] U.S. Cl. .............................. 372/102; 372/96; 372/44; 372/45
[58] Field of Search .............................. 372/96, 102, 46, 372/45, 44

[56] References Cited

U.S. PATENT DOCUMENTS 5,469,459  11/1995  Okuda et al. .............................. 372/46
5,568,505  10/1996  Okuda et al. .............................. 372/96

*Primary Examiner*—John D. Lee
*Assistant Examiner*—Quyen Phan Leung
*Attorney, Agent, or Firm*—Young & Thompson

[57] ABSTRACT

The present invention provides a grating structure partially provided in a semiconductor laser device having a first facet of a first reflectivity and a second facet of a second reflectivity which is larger than the first reflectivity. The grating structure extends within a half area near the first facet in the semiconductor laser device. The grating structure has a grating length in a cavity direction of not more than one third of a cavity length defined as a distance between the first and second facets. The grating structure has an integrated coupling coefficient value in the range of 0.4–0.6, the integrated coupling coefficient value is obtained by integrating coupling coefficient of the grating structure with positions in the cavity direction.

30 Claims, 18 Drawing Sheets

5,802,096

DISTRIBUTED FEED BACK LASER WITH A GRATING STRUCTURE ADJUSTED FOR A REDUCED INTERMODULATION DISTORTION IN AN ANALOG AMPLITUDE MODULATION AND METHOD FOR FABRICATING THE SAME

BACKGROUND OF THE INVENTION

The present invention relates to a semiconductor laser device with a grating structure.

A first conventional semiconductor laser device with a grating structure is disclosed in IEEE Phonics Technology Letters Vol. 2, No. 6 (1990) pp. 388–390. A second conventional semiconductor laser device with a grating structure is illustrated in FIG. 1, which is disclosed in the Japanese Laid-open Patent Application No. 62-219684. A third conventional semiconductor laser device with a grating structure is illustrated in FIG. 2, which is disclosed in the U.S. Pat. No. 5,111,475. A fourth conventional semiconductor laser device with a grating structure is illustrated in FIG. 3. A fifth conventional semiconductor laser device with a grating structure is illustrated in FIG. 4.

The above first to fount conventional laser devices show considerable large distortion in the second and third orders and high yields. The large distortions in the second and third orders are caused by large variations in intensity of the electric field. If the laser device is used for optical CATVs, then it is required that distortions in the second and third orders are small or ideally almost zero. For this reason, it had been required to develop a novel laser device with an improved grating adjusted for reductions of distortions in the second and third orders.

SUMMARY OF THE INVENTION

Accordingly, it is an object of the present invention to provide a novel grating structure in a laser for allowing the laser to show extremely small distortions in the second and third orders.

It is a further object of the present invention to provide a novel gating structure in a laser for allowing the laser to have a small variations intensity of electric field.

It is a further more object or the present invention to provide a novel grating structure in a laser for allowing the laser to have a yield.

The above and other objects features and advantages of the present invention will be apparent from the following descriptions.

The present invention provides a grating structure partially provided in a semiconductor laser device having a first facet of a first reflectivity and a second facet of a second reflectivity which is larger than the first reflectivity. The grating structure extends within a half area near the first facet in the semiconductor laser device. The grating structure has a grating length in a cavity direction of not more than one third of a cavity length defined as a distance between the first and second facets. The grating structure has an integrated coupling coefficient value in the range of 0.4–0.6, the integrated coupling coefficient value is obtained by integrating coupling coefficient of the grating structure with positions in the cavity direction.

BRIEF DESCRIPTIONS OF THE DRAWINGS

FIGS. 10–12, 13—13a; 14–17, 18–18a, 19–22, 23–23a, 24–24a, 25–42 are fragmentary cross sectional elevation views illustrative of novel lasers with improved grating structures according to the present invention.

Figure 43:
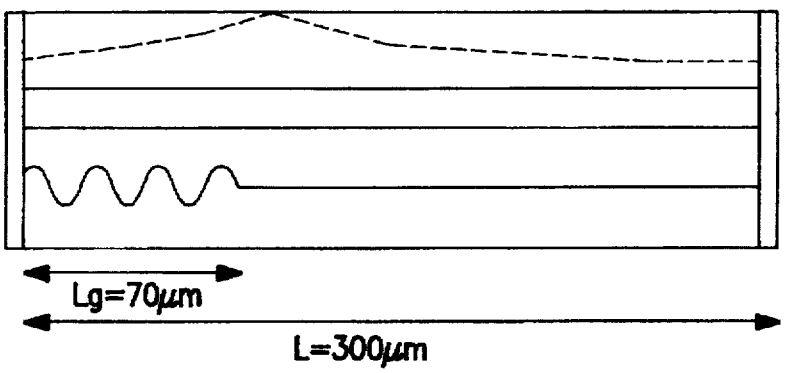

FIG. 43 is a fragmentary cross sectional elevation view illustrative of a novel laser with an improved grating structure in a first embodiment according to the present invention.

FIGS. 44A through 44E are fragmentary cross sectional elevation views illustrative of fabrication processes for a novel laser with an improved grating stricture in a first embodiment according to the present invention.

Figure 45:
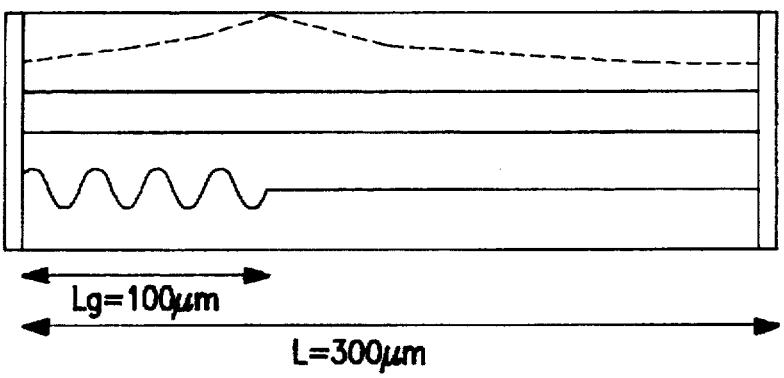

FIG. 45 is a fragmentary cross sectional elevation view illustrative of a novel laser with an improved grating structure in a second embodiment according to the present invention.

Figure 46:
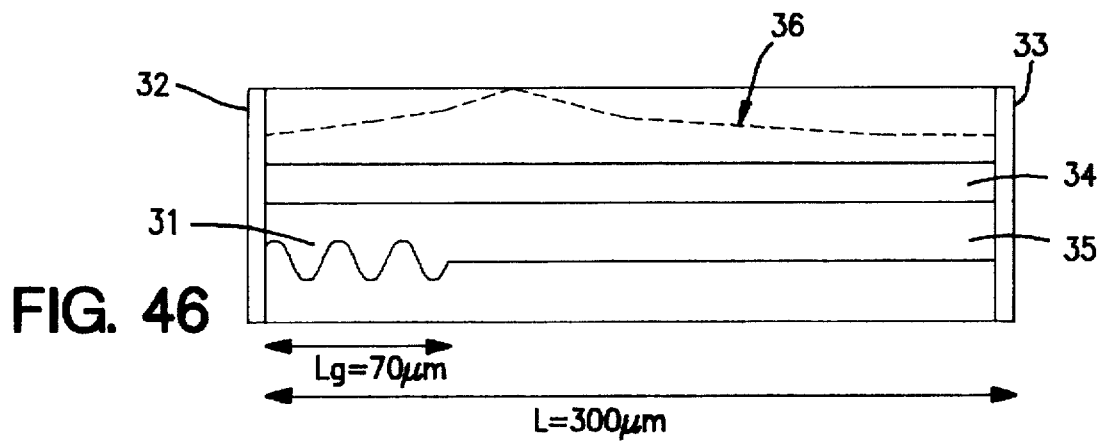

FIG. 46 is a fragmentary cross sectional elevation view illustrative of a novel laser with an improved grating structure in a third embodiment according to the present invention.

Figure 47:
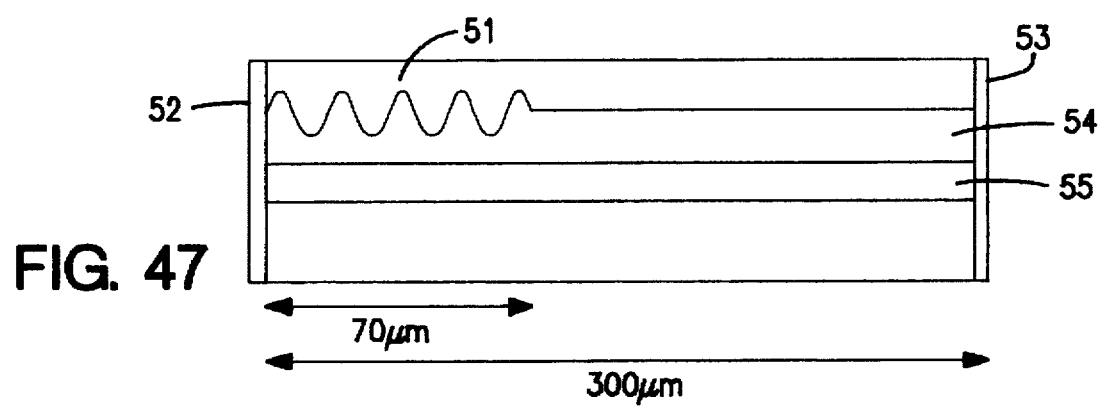

FIG. 47 is a fragmentary cross sectional elevation view illustrative of a novel laser with an improved grating structure in a fourth embodiment according to the present invention.

FIGS. 48A through 48E are fragmentary cross sectional elevation views illustrative of fabrication processes for a novel laser with an improved grating structure in a fourth embodiment according to the present invention.

Figure 49:
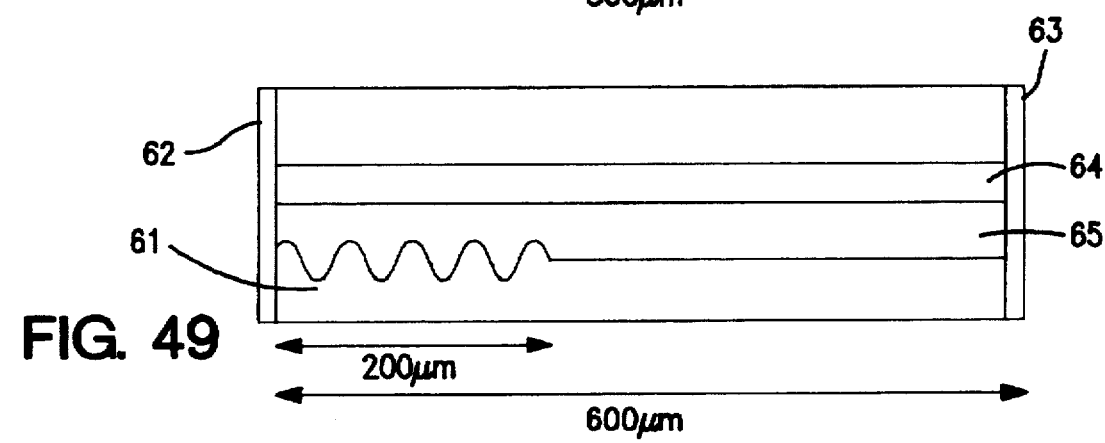

FIG. 49 is a fragmentary cross sectional elevation view illustrative of a novel laser with an improved grating structure in a fifth embodiment according to the present invention.

Figure 50:
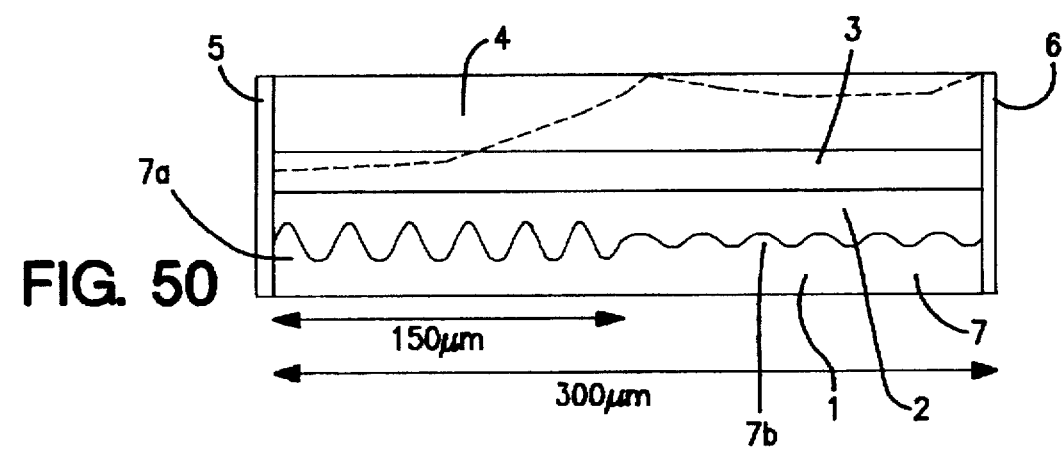

FIG. 50 is a fragmentary cross sectional elevation view illustrative of a novel laser with an improved grating structure in a sixth embodiment according to the present invention.

FIGS. 51A through 51E are fragmentary cross sectional elevation views illustrative of fabrication processes for a novel laser with an improved gating structure in a sixth embodiment according to the present invention.

Figure 52:
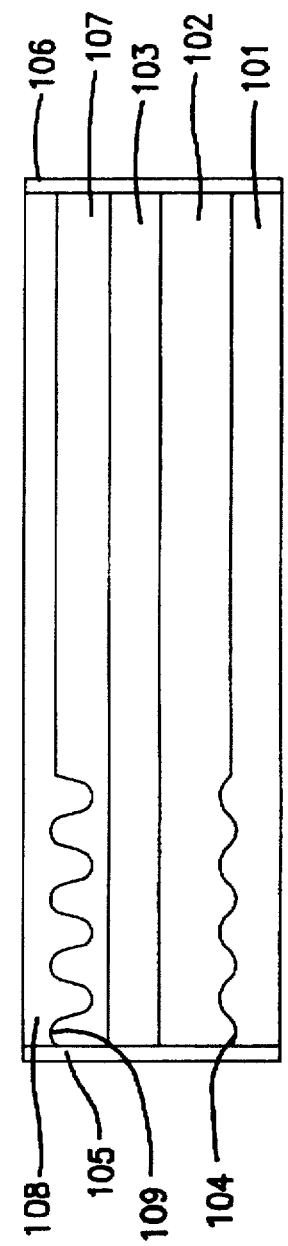

FIG. 52 illustrates an additional embodiment according to the present invention.

DISCLOSURE OF THE INVENTION

The present invention provides a grating structure partially provided in a semiconductor laser device having a first facet of a first reflectivity and a second facet of a second reflectivity which is larger than the first reflectivity. The grating structure extends within a half area near the first facet in the semiconductor laser device. The grating structure has a grating length in a cavity direction of not more than one third of a cavity length defined as a distance between the first and second facets. The grating structure has an integrated coupling coefficient value in the range of 0.4–0.6, the integrated coupling coefficient value is obtained by integrating coupling coefficient of the grating structure with positions in the cavity direction.

The above conditions of that the integrated coupling coefficient value of the grating structure in the range of 0.4–0.6 and that the grating length are essential for obtaining a relatively flat distribution in the intensity of the electric field. The grating is capable of reflecting a light as electromagnetic field wave or wave packet at a probability. The probability of the reflection of the light or photons depends both on the coupling coefficient and on the length of grating. More precisely, this reflection probability depends on the integrated value obtained by integrating the coupling coefficient with positions in the cavity direction. Such grating provided in the side of the first facet having the smaller reflectivity than the second reflectivity is thus capable of shifting the distribution in the intensity of the electric field toward the second facet. If no grating is provided, then the distribution in the intensity of the electric field has a large variation, wherein the intensity of the electric field is simply increased toward the first facet having the smaller reflectivity than the second facet. Further, the intensity of the electric field has a maximum value at the first facet and a minimum value at the second facet, wherein a difference between the maximum value and the minimum value is sufficiently large for allowing that the intensity of the luminescence of the laser device versus the injection current is non-linearly varied. Such non-linear variation in the intensity of the luminescence of the laser device causes the problem with the considerable intermodulation distortion as described in the background of the invention. If, however, the grating showing the light reflecting performance is provided in the side of the first facet, then the light may be reflected by either the grating or the first facet. The grating increases the probability of the reflection of the light in the first facet side toward the direction of the second facet side. For this reason, the grating provided in the first facet side causes a shift of the distribution in the intensity of the electric field, so as to reduce the difference between the maximum and minimum values, namely to change the largely varied distribution in the intensity of the electric field into a relatively flat distribution. Such relatively flat distribution in the intensity of the electric field may have a maximum value at any position in an intermediate region distanced from both the first and second facets. When the laser device is used for an optical CATV, it is, however, required that the degree of the flatness of the electric field intensity distribution is sufficiently large for obtaining almost no or extremely small intermodulation distortions in the second and third orders. If the degree of the flatness of the electric field intensity distribution is sufficiently large for obtaining almost no or extremely small intermodulation distortions in the second and third orders, this means that the luminescence intensity of the laser device is linearly or proportionally varied over injection current values. Namely, such desirable property of luminescence intensity is, therefore, required to obtain almost no or extremely small intermodulation distortions in the second and third orders. This is the first requirement. A secondary requirement is to keep a high yield of the laser device. Even if the above first requirement for obtaining almost no or extremely small intermodulation distortions in the second and third orders is satisfied, a low yield of the laser device is undesirable.

In consideration of the above, it was confirmed by the inventor of the present invention that, in order to satisfy the above first and second requirements, namely to obtain both the required proportional variation in the luminescence intensity and a relatively high yield, it is required to satisfy at least the following two conditions. The first essential condition is that the integrated coupling coefficient value obtained by integrating coupling coefficient of the grating with positions in the cavity direction is in the range of 0.4–0.6. The second essential condition is that the length in the cavity direction of the grating be within one third of the cavity length which is defined as a distance between the first and second facets having the individual reflectivities.

Figure 1:
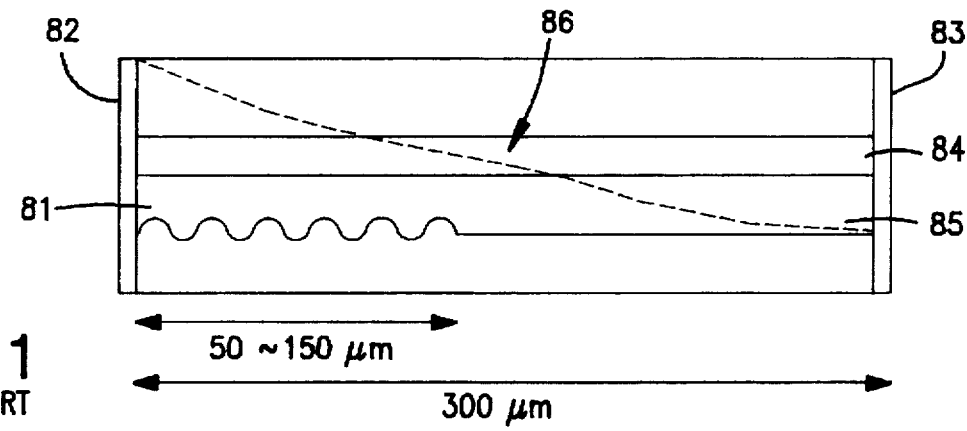
FIGS. 1 through 4 are fragmentary cross sectional elevation views illustrative of the conventional lasers with grating structures.
Figure 2:
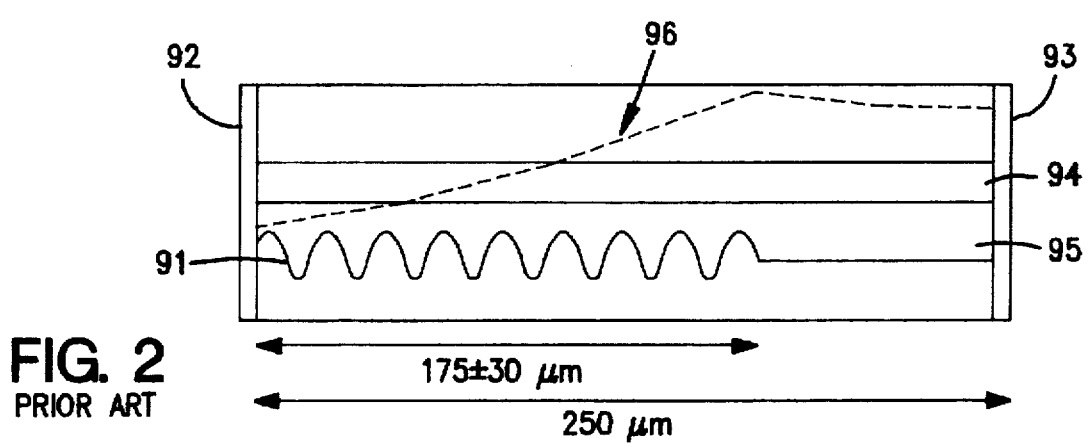
Figure 3:
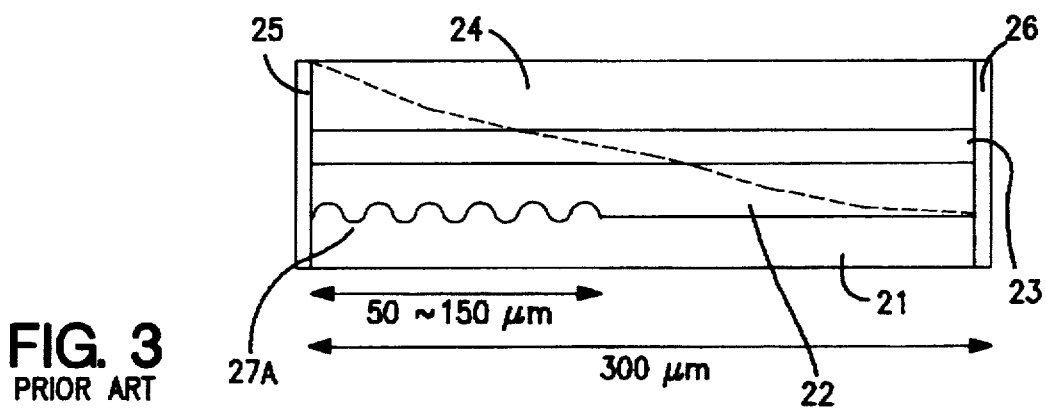
Figure 4:
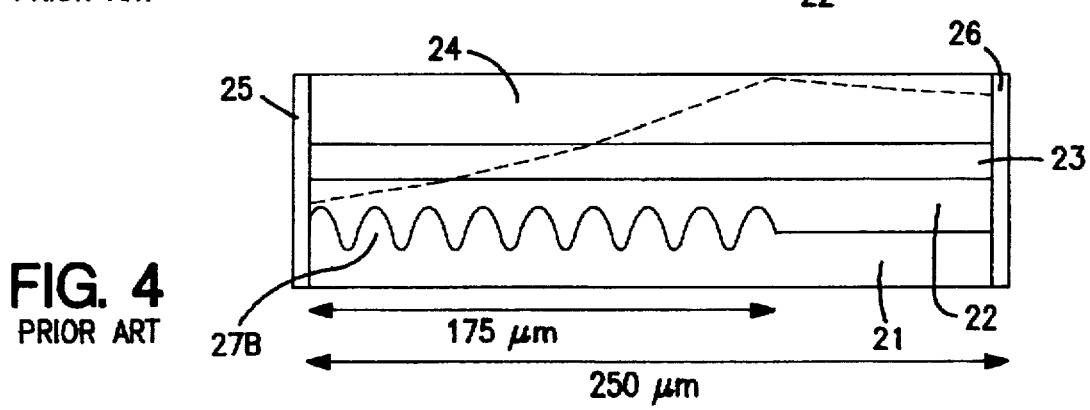
Figure 5:
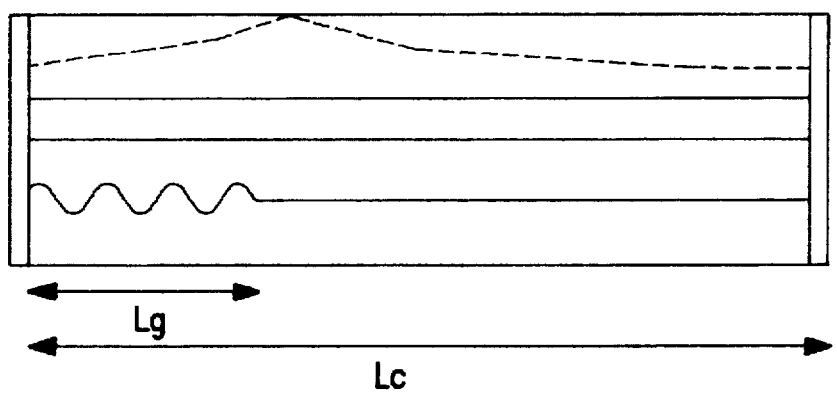
FIG. 5 is a fragmentary cross sectional elevation view illustrative of a novel laser with an improved grating structure according to the present invention.
Figure 10:
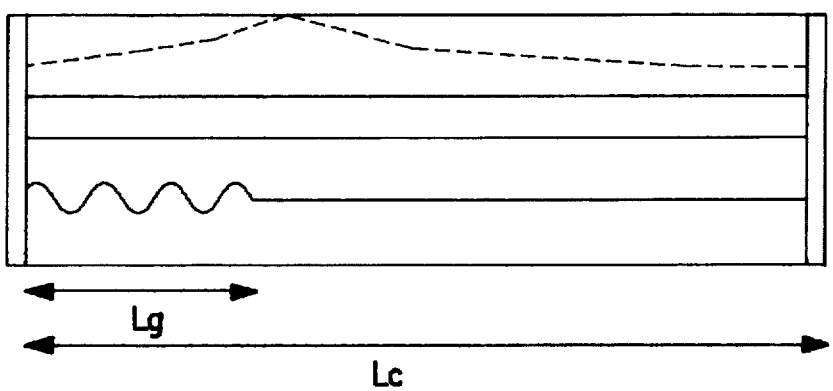

Further, in order to obtain improvements both in yield of the laser device and the degree of flatness of the electric field intensity distribution, it is required to further satisfy, as illustrated in FIG. 5, the third condition that an averaged amplitude of grating is in the range of 200–260 angstroms, wherein the averaged amplitude of grating is calculated by dividing, by a length of gating, an integrated value which is obtained by integrating amplitude of the grating with positions in the cavity direction. FIG. 5 illustrates that if the above first, second and third conditions are satisfied, then it is caused that an electric field intensity distribution is sufficiently flat for obtaining almost no or extremely small intermodulation distortions in the second and third orders. However, even if the essential first and second conditions only are satisfied but the third condition is not satisfied, it is also caused that an electric field intensity distribution is sufficiently flat for obtaining almost no or extremely small intermodulation distortions in the second and third orders, whereas the yield may be lower than when the first, second and third conditions are satisfied.

Figure 6:
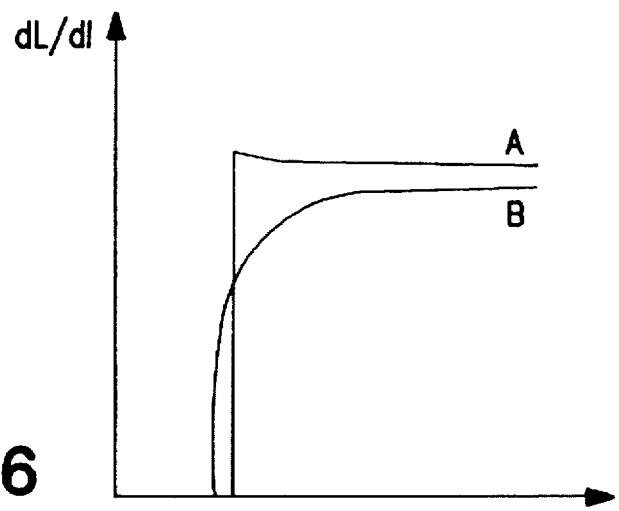
FIG. 6 is a diagram illustrative of variations in differential coefficients of luminescence versus injection current within the modulation frequency range of the laser device.

FIG. 6 illustrates variations in differential coefficients of luminescence versus injection current within the modulation frequency range of the laser device. In FIG. 6, the real line "A" represents the property of the novel laser device of the present invention, wherein the above first, second and third conditions are satisfied. The real line "B" represents the property of the conventional laser device, wherein both the above essential first and second conditions are not satisfied.

The real line "A" demonstrates that the differential coefficient of luminescence versus injection current remains unchanged in relation to variations of the injection current. This means that the intensity of the luminescence of the laser device, which satisfies at least the above essential first and second conditions, is linearly or proportionally increased as the injection current is increased. This further suggests that the laser device, which satisfies at least the above essential first and second conditions, shows almost no or extremely small intermodulation distortions in the second and third orders. This means that the laser device, which satisfies at least the above essential first and second conditions, has a sufficiently excellent property for satisfying the requirements for the optical CATV.

By contrast, the real line "B" demonstrates that the differential coefficient of luminance versus injection current is varied in relation to variations of the injection current. This means that the intensity of the luminescence of the laser device, which fails to satisfy at least both the above essential first and second conditions, is not proportionally increased as the injection current is increased. This further suggests that the laser device, which fails to satisfy at least both the above essential first and second conditions, shows unignorable or considerable intermodulation distortions in the second and third orders. This means that the laser device, which fails to satisfy at least both the above essential first and second conditions, can not be used for the optical CATV. Whereas in the above calculation, it was conditioned that the cavity length is 300 micrometers, the above property differential coefficient of the luminescence intensity versus injection current remains when the cavity length is within the range of 200–600 micrometers since the threshold carrier density capable of providing any influence to the performance of the laser is almost unchanged.

Figure 7:
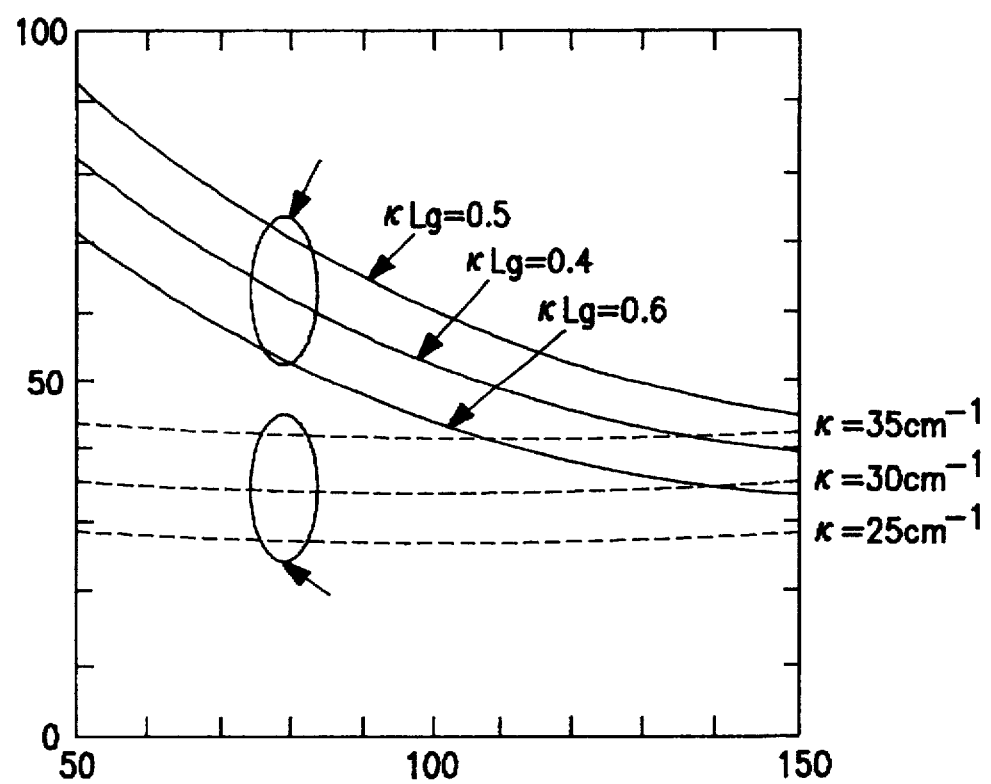
FIG. 7 is a diagram illustrative of variations in yield of the novel and conventional laser devices versus the grating length.

It was further confirmed by the inventor of the present invention that if at least the above essential first and second conditions are satisfied, then the yield is increased by shortening the length of the grating. FIG. 7 illustrates variations in yield of the novel and conventional laser device versus the grating length. The yield was calculated under the following conditions. The cavity length is 300 micrometers. Current-luminescence property is calculated in consideration of the distribution in the cavity direction of the electric field intensity. The intermodulation distortion in the third order is then calculated from the obtained current-luminescence property. The yield is theoretically calculated in considerations of both the obtained intermodulation distortion in the third order and variations in phase of the grating at the first facet. The used regulations of the intermodulation distortion are as follows. Optical output in average is not less than 8 mW. The intermodulation distortion in the third order is not more than −80 dBc provided that two input signals for 20% optical modulation are inputted. It is required that the difference "$\Delta\alpha L$" of the actual reflection mirror loss from the regulated reflection mirror loss is not less than 0.05 as an additional condition for allowing the laser to show a stable performance in the single mode.

In FIG. 7, the three real lines represent variations in yield versus the grating length of the laser device, which satisfy at least the above essential first and second conditions. The top real line represents the yield when the product of the coupling coefficient "$\kappa$" and the grating length "Lg" is equal to 0.5. The middle real line represents the yield when the product of the coupling coefficient "$\kappa$" and the grating length "Lg" is equal to 0.4. The bottom real line represents the yield when the product of the coupling coefficient "$\kappa$" and the grating length "Lg" is equal to 0.6. All of the three real lines demonstrate that the yield is simply and considerably increased as the grating length is reduced from 150 micrometers to 50 micrometers. When the product of the coupling coefficient "$\kappa$" and the grating length "Lg" is equal to 0.6 and the grating length is 50 micrometers, then the yield is over 70%. When the product of the coupling coefficient "$\kappa$" and the grating length "Lg" is equal to 0.4 and the grating length is 50 micrometers, then the yield is over 80%. When the product of the coupling coefficient "$\kappa$" and the grating length "Lg" is equal to 0.5 and the grating length is 50 micrometers, then the yield is indeed over 90%.

By contrast, the three broken lines represent variations in yield versus the grating length of the laser device, which fail to satisfy both the above essential first and second conditions. The top broken line represents the yield when the coupling coefficient "$\kappa$" is equal to 35 $cm^{-1}$. The middle broken line represents the yield when the coupling coefficient "$\kappa$" is equal to 30 $cm^{-1}$. The bottom broken line represents the yield when the coupling coefficient "$\kappa$" is equal to 25 $cm^{-1}$. All of the three broken lines demonstrate that the yield remains unchanged over the grating length in the range of 50–150 micrometers. When the coupling coefficient "$\kappa$" is equal to 35 $cm^{-1}$, then the yield remains at about 45%. When the coupling coefficient "$\kappa$" is equal to 30 $cm^{-1}$, then the yield remains near 35%. When the coupling coefficient "$\kappa$" is equal to 2 $cm^{-1}$, then the yield remains under 30%. The conventional distributed feedback laser disclosed in the Japanese Laid-Open Patent Application No. 62-219684 has a coupling coefficient of about 30 $cm^{-1}$. This means that the yield of this conventional distributed feedback laser is about 35% only.

Figure 8:
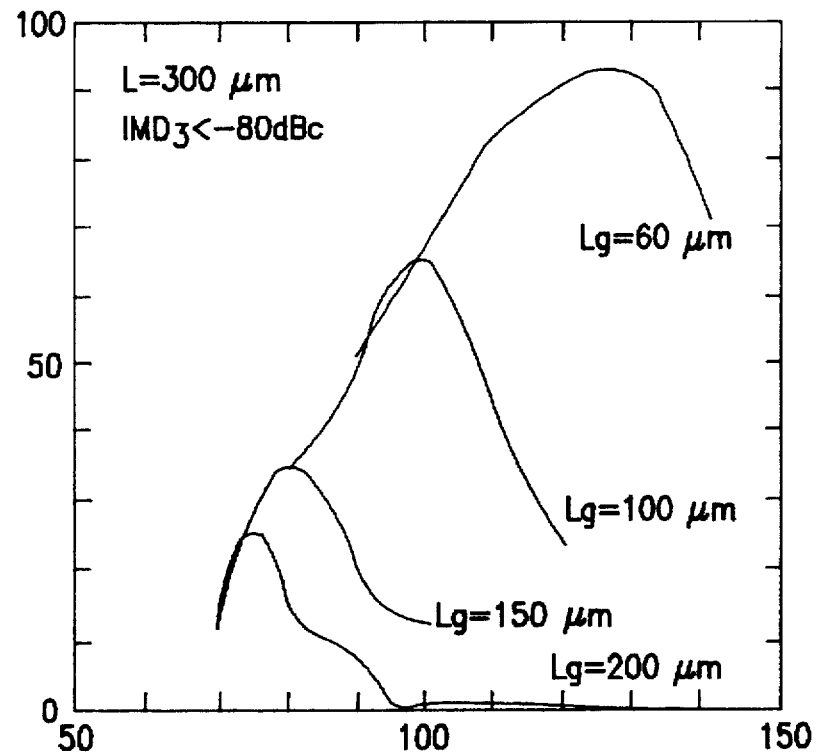
FIG. 8 is a diagram illustrative of variations of yield versus coupling coefficient for various grating lengths.

FIG. 8 illustrates variations of yield versus coupling coefficient for various grating lengths. The conditions for calculating the yield are that the cavity length is set at 300 micrometers, an,d that the intermodulation distortion in the third order is not more than −80 dBc. The top real line represents the variation in yield versus coupling coefficient of the laser device when the grating length is equal to 60 micrometers. The second top real line represents the variation in yield versus coupling coefficient of the laser device when the grating length is equal to 100 micrometers. The third top real line represents the variation in yield versus coupling coefficient of the laser device when the grating length is equal to 150 micrometers. The bottom real line represents the variation in yield versus coupling coefficient of the laser device when the grating length is equal to 200 micrometers. When the grating length is equal to 60 micrometers, then the yield has a maximum value of indeed about 95% at a coupling coefficient of about 75 $cm^{-1}$. When the grating length is equal to 100 micrometers, then the yield has a maximum value near 70% at a coupling coefficient near 50 $cm^{-1}$. When the grating length is equal to 150 micrometers, then the yield has a maximum value under 40% at a coupling coefficient near 30 $cm^{-1}$. When the grating length is equal to 200 micrometers, then the yield has a maximum value under 30% at a coupling coefficient of about 25 $cm^{-1}$. The above four real lines demonstrate that the reduction of the grating length considerably raises the yield of the laser device. For this reason, in view of obtaining the high yield, it is essential to satisfy the above second essential condition that the grating length is not more than one third of the cavity length in order to render the grating length short.

Figure 9:
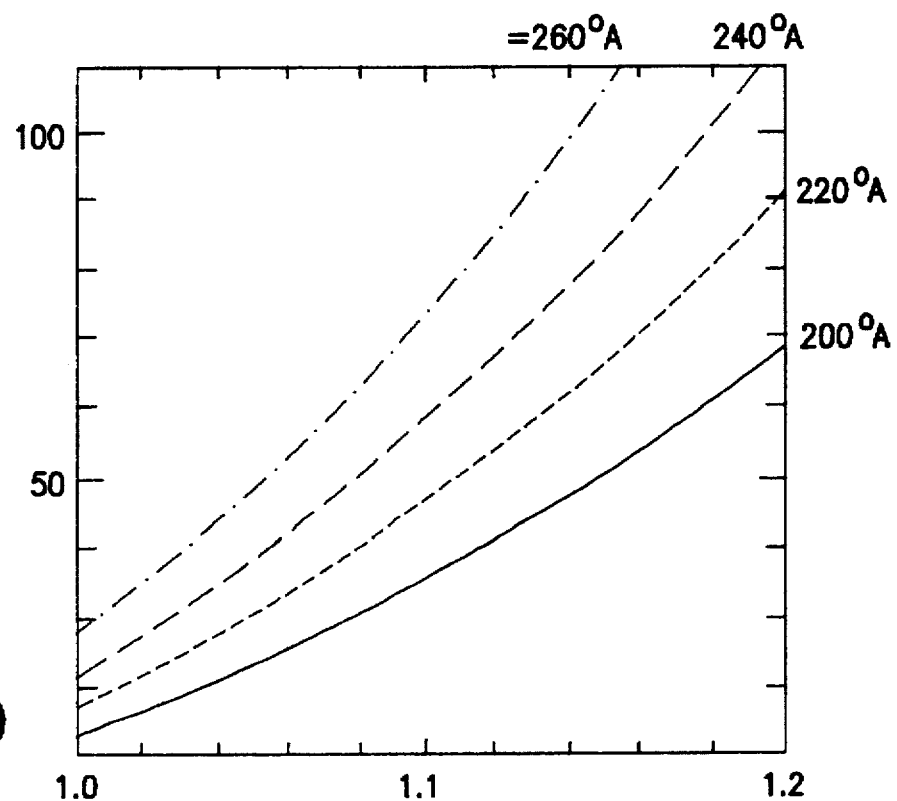
FIG. 9 is a diagram illustrative of variations in coupling coefficient of grating versus wavelength composition of compound semiconductor of which the optical guide layer is made.

The coupling coefficient of grating is one of the parameters for satisfying the above first essential condition that the integrated coupling coefficient value obtained by integrating coupling coefficient of the grating with positions in the cavity direction is in the range of 0.4–0.6. The coupling coefficient of grating is varied in association with both the amplitude of grating and the energy band gap, namely the wavelength composition of compound semiconductor of the optical guide layer. FIG. 9 illustrates variations in coupling coefficient of grating versus wavelength composition of compound semiconductor of which the optical guide layer is made. In FIG. 9, the real line represents variations of coupling coefficient versus the wavelength composition when the grating amplitude is 200 angstroms. The dotted line represents variations of coupling coefficient versus the wavelength composition when the grating amplitude is 220 angstroms. The broken line represents variations of coupling coefficient versus the wavelength composition when the grating amplitude is 240 angstroms. The broken and dotted line represents variations of coupling coefficient versus the wavelength composition when the grating amplitude is 260 angstroms. The real line demonstrates that when the grating amplitude is 200 angstroms, then the coupling coefficient of grating is simply increased by increasing the wavelength composition or by decreasing the energy band gap of the compound semiconductor of which the optical guide layer is made. The dotted line demonstrates that when the grating amplitude is 220 angstroms, then the coupling coefficient of grating is also simply increased by increasing the wavelength composition or by decreasing the energy band gap of the compound semiconductor of which the optical guide layer is made. The broken line demonstrates that when the grating amplitude is 240 angstroms, then the coupling coefficient of grating is also simply increased by increasing the wavelength composition or by decreasing the energy band gap of the compound semiconductor of which the optical guide layer is made. The broken and dotted line demonstrates that when the grating amplitude is 260 angstroms, then the coupling coefficient of grating is also simply increased by increasing the wavelength composition or by decreasing the energy band gap of the compound semiconductor of which the optical guide layer is made. Those prove that the coupling coefficient of grating is increasing by increasing the wavelength composition of the compound semiconductor of the optical guide layer, provided that the amplitude of the grating remains unchanged. At the same wavelength composition, the dotted and broken line has the top position. The broken line has the second top position. The dotted line has the third top position. The real lines has the bottom position. Those prove that at the same wavelength composition, the coupling coefficient of grating is increased by increasing the amplitude of grating.

In any event, in order to obtain both the required proportional variation in the luminescence intensity and a relatively high yield, it is required to satisfy both the first essential condition that the integrated coupling coefficient value obtained by integrating coupling coefficient of the grating with positions in the cavity direction is required to be in the range of 0.4–0.6, and the second essential condition that the length in the cavity direction of the grating is required to be within one third of the cavity length which is defined as a distance between the first and second facets having the individual reflectivities. Further, in order to obtain improvements both in yield of the laser device and the degree of flatness of the electric field intensity distribution, it is required to further satisfy the third condition that the averaged amplitude of grating is in the range of 200–260 angstroms, wherein the averaged amplitude of grating is calculated by dividing, by a length of grating, an integrated value which is obtained by integrating amplitude of the grating with positions in the cavity direction.

The descriptions will hereinafter highlight any grating structures available for satisfying at least the above first and second essential conditions, and further the above third condition as well as additional conditions for obtaining improvements both in the degree of flatness of the electric field intensity and in the yield of the laser device.

The present invention provides a grating structure partially provided in a semiconductor laser device having a first facet of a first reflectivity and a second facet of a second reflectivity which is larger than the first reflectivity. The grating structure extends within a half area near the first facet in the semiconductor laser device. The grating structure has a grating length in a cavity direction of not more than one third of a cavity length defined as a distance between the first and second facets. The grating structure has an integrated coupling coefficient value in the range of 0.4–0.6, the integrated coupling coefficient value is obtained by integrating coupling coefficient of the grating structure with positions in the cavity direction. FIG, 10 illustrates the structure of the distributed feedback laser having this improved grating structure.

Figure 11:
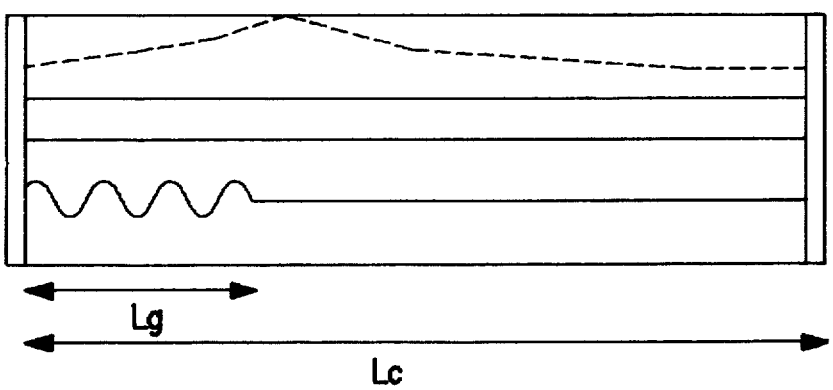
Figure 12:
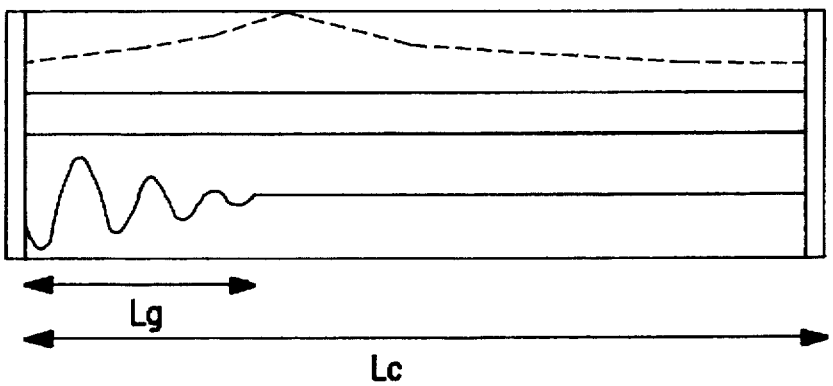
Figure 13:
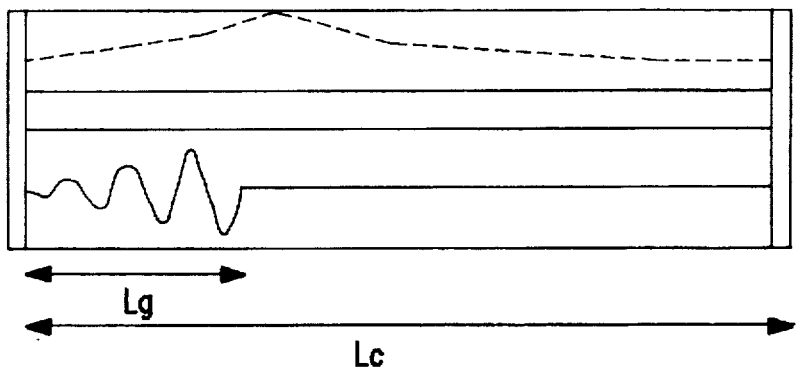
Figure 13A:
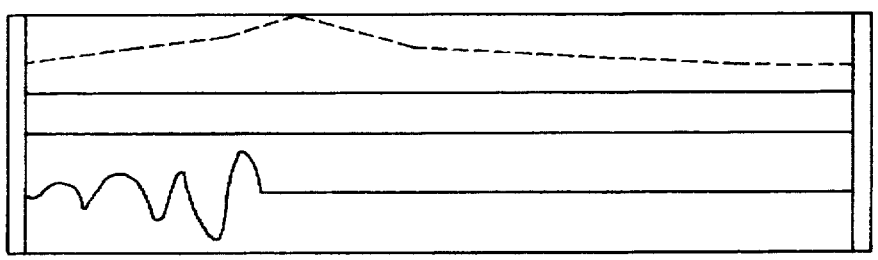

It is available that the grating structure comprises a single grating which continuously extends from the first facet toward a center of the semiconductor laser device. In this case, the single grating may have a constant amplitude ill the range of 200–260 angstroms as illustrated in FIG. 11. In place of the constant amplitude, it is also available that the single grating has amplitudes which are continuously varied over positions in the cavity direction. In this case, the amplitudes may linearly be varied over positions in the cavity direction. For example, the amplitudes are proportionally increased toward the first facet as illustrated in FIG. 12. Alternatively, the amplitudes are proportionally decreased toward the first facet as illustrated in FIG. 13. In place of linear variation in the amplitude, it is available that the amplitudes are non-linearly varied over positions in the cavity direction as illustrated in FIG. 13A.

Figure 14:
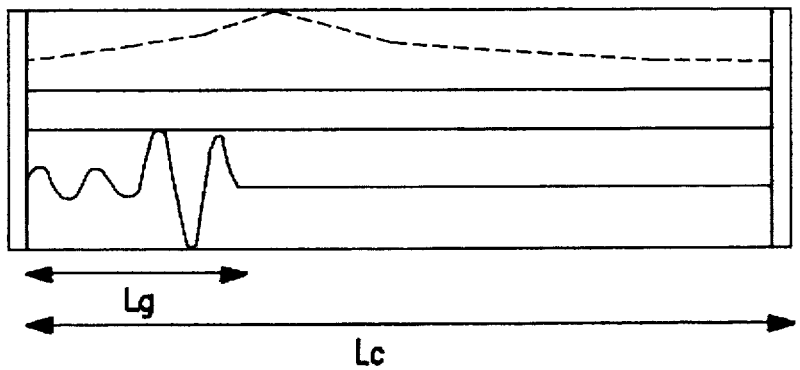
Figure 15:
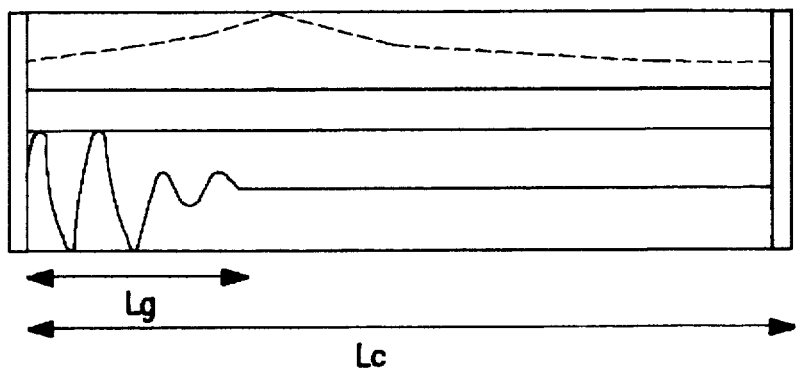

In place of the continuous variation in amplitude of the grating, it is further available that the single grating, has amplitudes which are discontinuously varied over positions in the cavity direction. In this case, the amplitudes may comprise a plurality of different amplitudes. For example, the amplitudes comprise a first amplitude and a second amplitude larger than the first amplitude, and the grating has the first amplitude on a first region near the first facet, and the grating has the second amplitude on a second region apart from the first facet as illustrated in FIG. 14. Alternatively, the amplitudes may comprise a first amplitude and a second amplitude larger than the first amplitude, and wherein the grating has the second amplitude on a first region near the first facet, and the grating has the first amplitude on a second region apart from the first facet as illustrated in FIG. 15.

Figure 16:
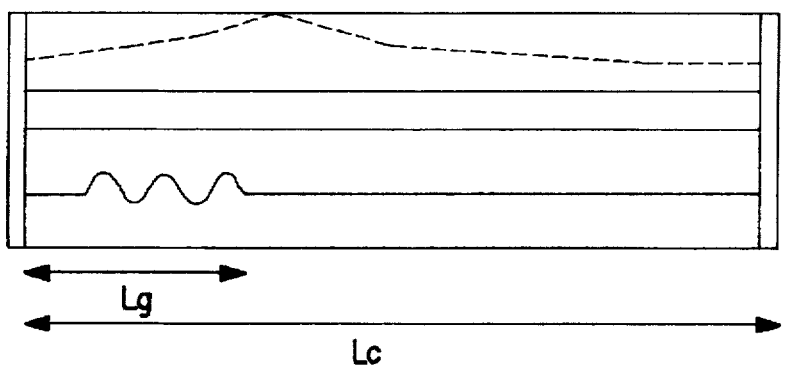
Figure 17:
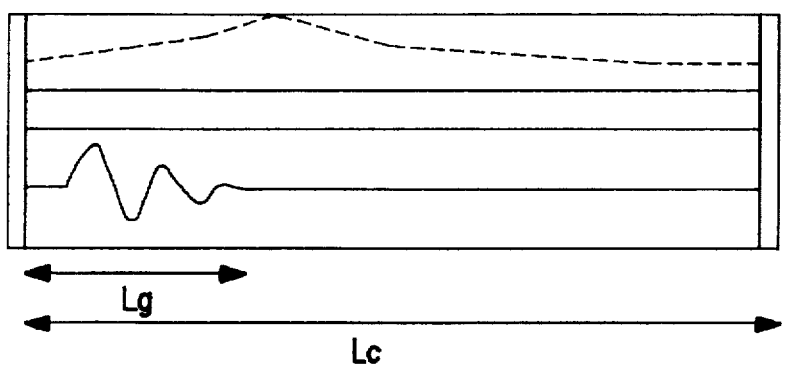
Figure 18:
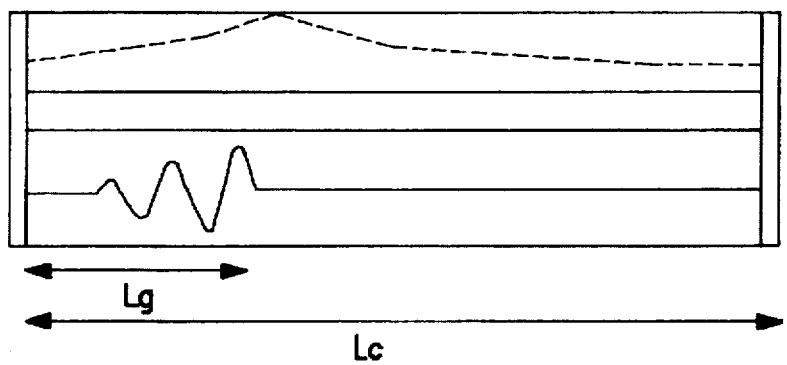
Figure 18A:
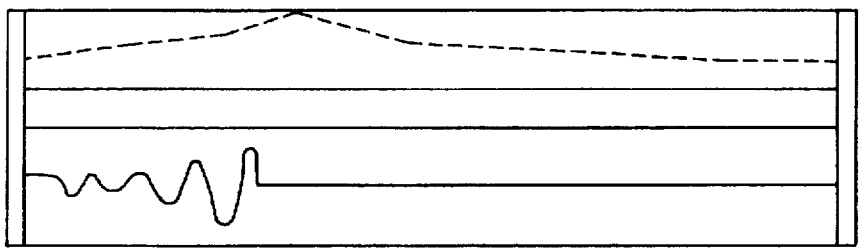

Moreover, it is available that the grating structure may comprise a single grating which is distanced from the first facet and continuously extends toward a center of the semiconductor laser device, provided that the above essential first, second and third conditions are satisfied. In this case, the single grating may have a constant amplitude as illustrated in FIG. 16. In place of the constant amplitude of the gating, it is also available that the single grating has amplitudes which are continuously varied over positions in the cavity direction. In this case, the amplitudes may be linearly varied over positions in the cavity direction. For example, the amplitudes are proportionally increased toward the first facet as illustrated in FIG. 17. Alternatively, it is also available that the amplitudes are proportionally decreased toward the first facet as illustrated in FIG. 18. In place of the above linear variation in amplitude of grating, it is also available that the amplitudes are non-linearly varied over positions in the cavity direction as illustrated in FIG. 18A.

Figure 19:
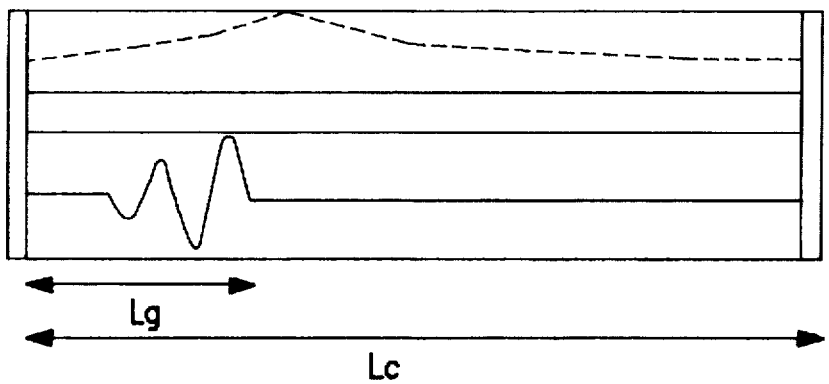
Figure 20:
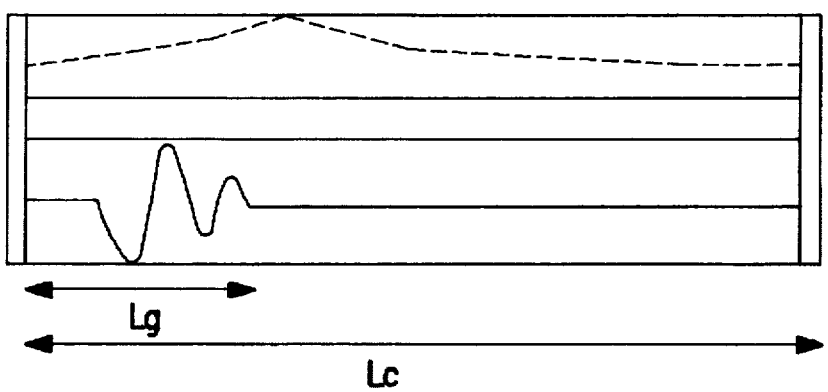

Furthermore, in place of the continuous variation in amplitude of grating distanced from the first facet, it is available that the single grating has amplitudes which are discontinuously varied over positions in the cavity direction. In this case, the amplitudes may comprise a plurality of different amplitudes. For example, the amplitudes comprise a first amplitude and a second amplitude larger than the first amplitude, and the grating has the first amplitude on a first region near the first facet, and the grating has the second amplitude on a second region apart from the first facet as illustrated in FIG. 19. Alternatively, the amplitudes may comprise a first amplitude and a second amplitude larger than the first amplitude, and the grating has the second amplitude on a first region near the first facet, and the grating has the first amplitude on a second region apart from the first facet as illustrated in FIG. 20.

Figure 21:
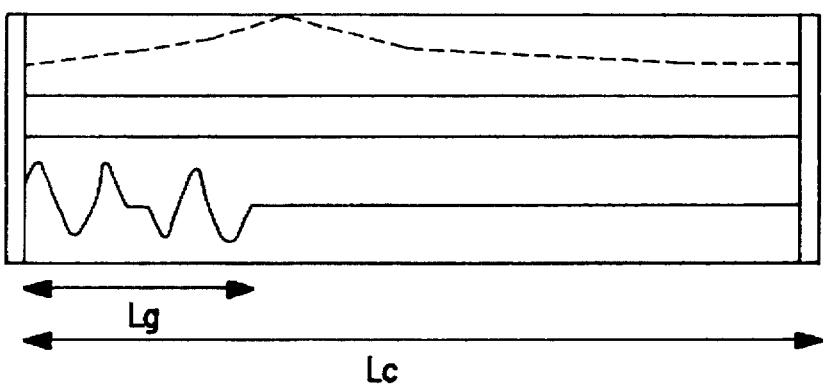
Figure 22:
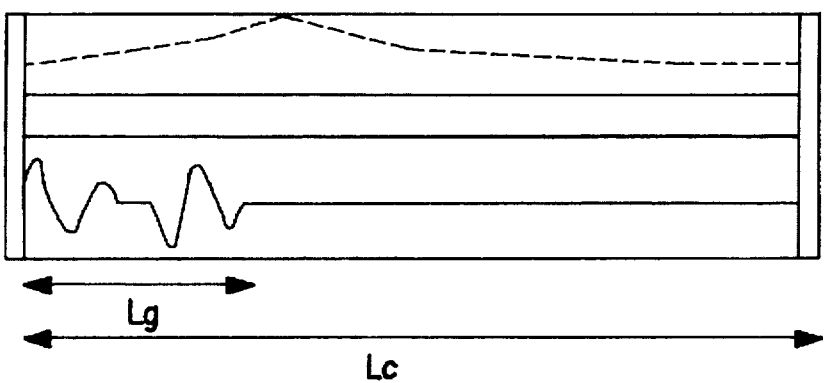
Figure 23:
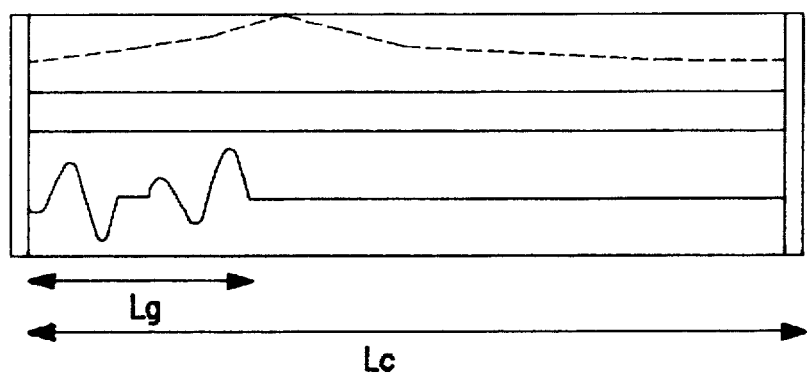
Figure 23A:
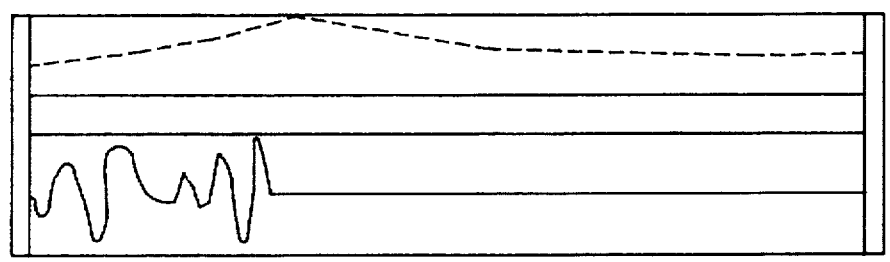

Still further, in place of the above single grating, it is available that the grating structure comprises a plurality of gratings which discontinuously extend from the first facet toward a center of the semiconductor laser device. For example, the grating structure may comprise a first grating which continuously extends from the first facet, and a second grating which is distanced from the first grating and continuously extends toward a center of the semiconductor laser device. In this case, a plurality of gratings may have a constant amplitude as illustrated in FIG. 21. In place of the above constant amplitude, a plurality of gratings may have amplitudes which are continuously varied over positions in the cavity direction. In this case, the amplitudes may be linearly varied over positions in the cavity direction. For example, the amplitudes are proportionally increased toward the first facet as illustrated in FIG. 22. Alternatively, the amplitudes are proportionally decreased toward the first facet as illustrated in FIG. 23. In place of the linear variation in amplitude of the grating, it is also available that the amplitudes are non-linearly varied over positions in the cavity direction as illustrated in FIG. 23A.

Figure 24:
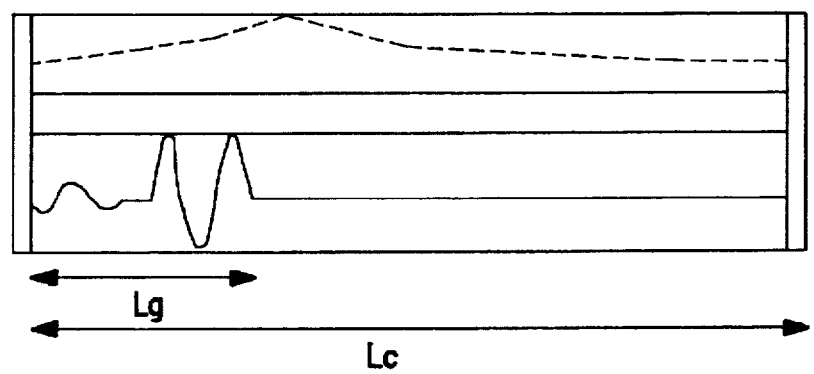
Figure 25:
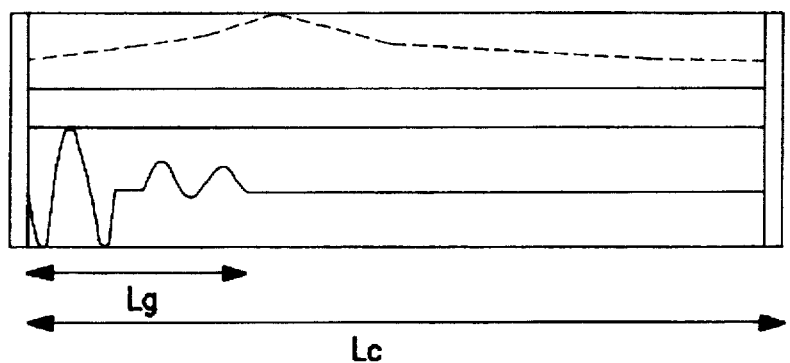

Yet further, in place of the continuous variation in amplitude of grating, it is available that a plurality of gratings have amplitudes which are discontinuously varied over positions in the cavity direction. In this case, the amplitudes may comprise a plurality of different amplitudes as illustrated in FIGS. 24 and 25.

Figure 26:
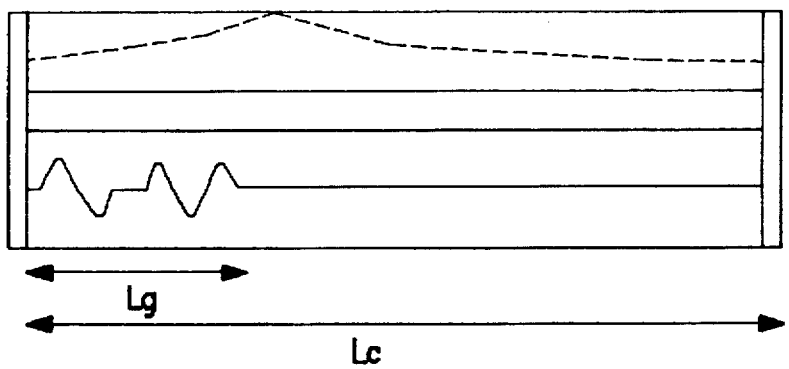
Figure 27:
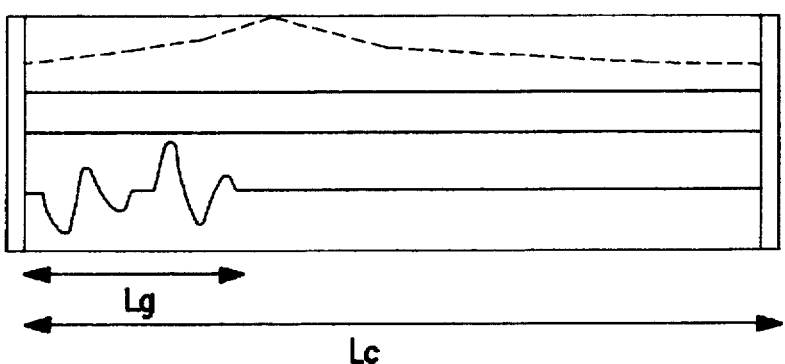
Figure 28:
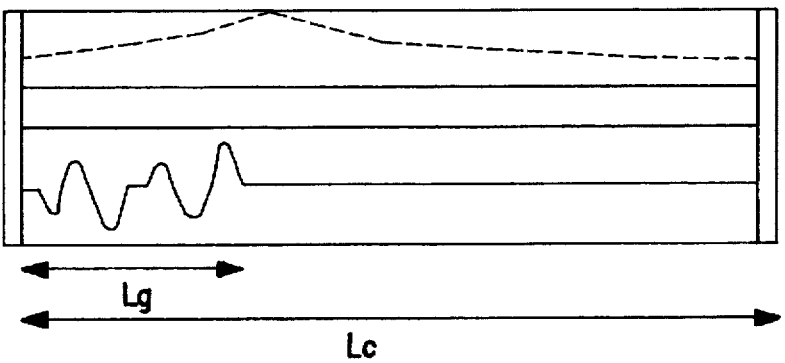

Moreover, it is available that the grating structure comprises a plurality of gratings which are distanced from the first facet and discontinuously extend toward a center of the semiconductor laser device, provided that the above first, second and third essential conditions are satisfied. In this case, the grating structure may comprise a first grating which is distanced from the first facet and, a second grating which is distanced from the first grating and continuously extends toward a center of the semiconductor laser device, wherein the gratings have a constant amplitude as illustrated in FIG. 26. In place of the constant amplitude of grating, it is available that the gratings have amplitudes which are continuously varied over positions in the cavity direction. In this case, the amplitudes may be linearly varied over positions in the cavity direction. For example, the amplitudes are proportionally increased toward the first facet as illustrated in FIG. 27. Alternatively, the amplitudes are proportionally decreased toward the first facet as illustrated in FIG. 28.

Figure 24A:
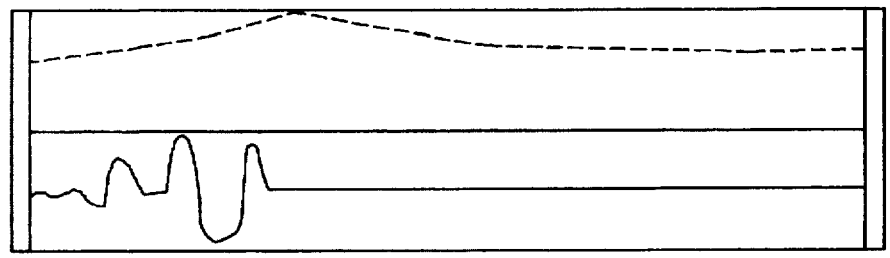

In place of the linear variation in amplitude of the plural gratings, it is also available that the amplitudes are non-linearly varied over positions in the cavity direction. In this case, a plurality of gratings may have amplitudes which are discontinuously varied over positions in the cavity direction. For example, the amplitudes may comprise a plurality of different amplitudes as illustrated by FIG. 24A.

It is preferable that the cavity length is in the range of 200–600 micrometers for the reason that the injection carrier density capable of providing any influence to the performance of the laser device remains unchanged when the cavity length is in the range of 200–600 micrometers.

Figure 29:
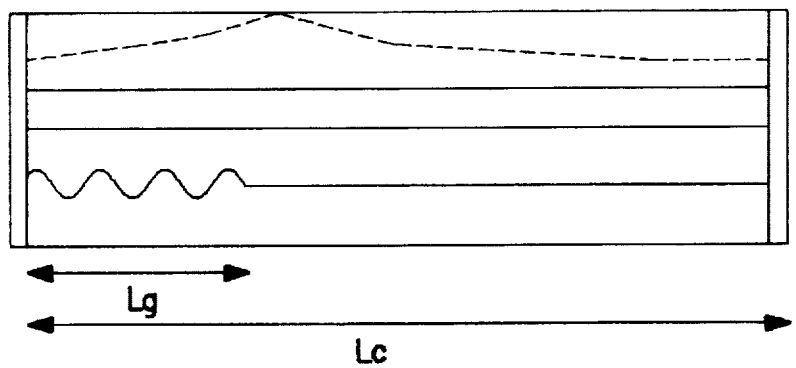

It is preferable that the grating structure is provided on an interface between an InP layer and an InGaAsP optical guide layer, and the grating structure has an averaged amplitude value in the range of 200 to 260 angstroms as illustrated in FIG. 29, wherein the averaged amplitude value is obtained by dividing an integrated value by the grating length, and wherein the integrated value is obtained by integrating amplitude of the grating structure with positions in the cavity direction. In this case, it is more preferable that the InGaAsP optical guide layer has a thickness in the range of 800–1200 angstroms. It is moreover preferable that the InGaAsP optical guide layer has a constant energy band gap corresponding to a wavelength composition in the range of 1.12–1.16 micrometers, and wherein the grating length is in the range of 40–100 micrometers as illustrated in FIG. 29.

Figure 30:
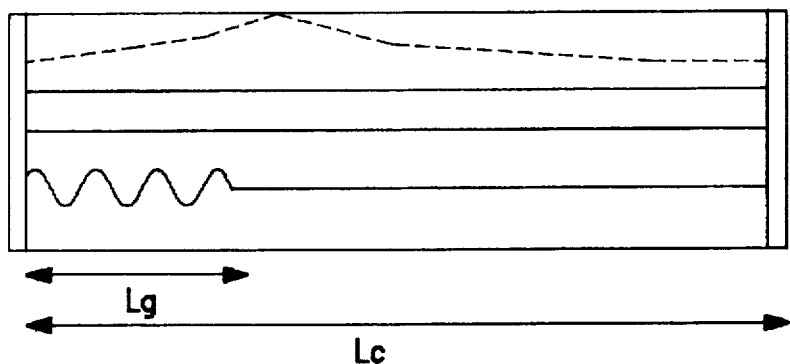

It is furthermore available that the InGaAsP optical guide layer has a constant energy band gap corresponding to a wavelength composition in the range of 1.13–1.15 micrometers, wherein the grating length is in the range of 40–100 micrometers, and wherein the averaged amplitude value is in the range of 220–240 angstroms as illustrated in FIG. 30.

Figure 31:
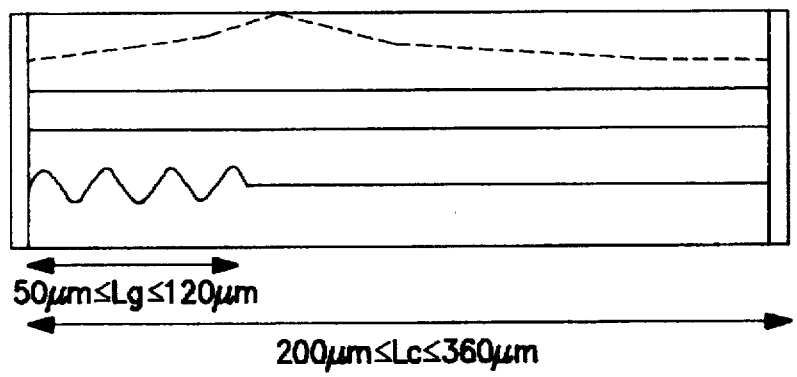

It is also available that the InGaAsP optical guide layer has a constant energy band gap corresponding to a wavelength composition in the range of 1.08–1.12 micrometers, wherein the grating length is in the range of 50–120 micrometers, wherein the averaged amplitude value is in the range of 220–260 angstroms, and wherein the cavity length is in the range of 200–360 micrometers as illustrated in FIG. 31.

Figure 32:
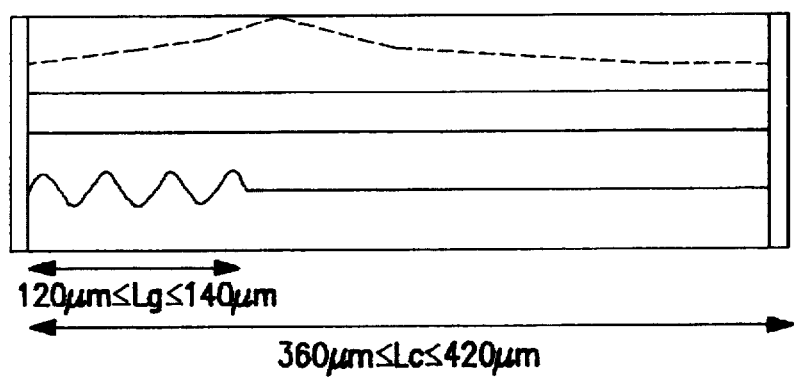

It is also available that the InGaAsP optical guide layer has a constant energy band gap corresponding to a wavelength composition in the range of 1.08–1.12 micrometers, wherein the grating length is in the range of 120–140 micrometers, wherein the averaged amplitude value is in the range of 200–220 angstroms, and wherein the cavity length is in the range of 360–420 micrometers as illustrated in FIG. 32.

Figure 33:
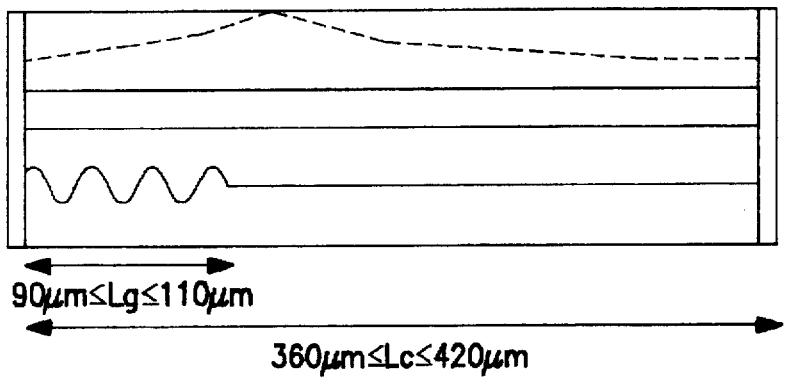

It is also available that the InGaAsP optical guide layer has a constant energy band gap corresponding to a wavelength composition in the range of 1.09–1.11 micrometers, wherein the grating length is in the range of 90–110 micrometers, wherein the averaged amplitude value is in the range of 220–240 angstroms, and wherein the cavity length is in the range of 360–420 micrometers as illustrated in FIG. 33.

Figure 34:
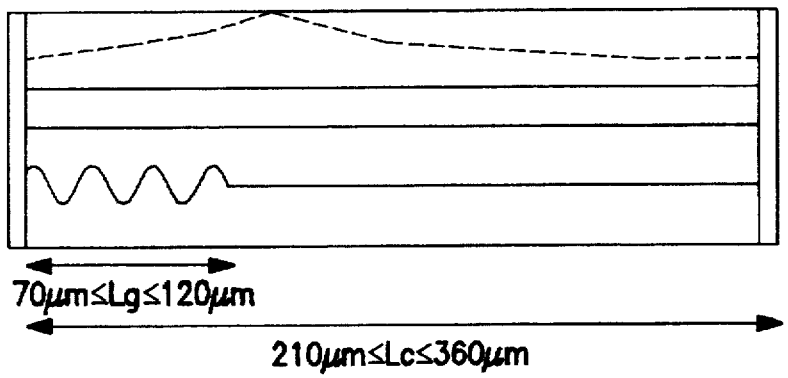

It is also available that the InGaAsP optical guide layer has a constant energy band gap corresponding to a wavelength composition in the range of 1.04–1.08 micrometers, wherein the grating length is in the range of 70–120 micrometers, wherein the averaged amplitude value is in the range of 240–260 angstroms, and wherein the cavity length is in the range of 210–360 micrometers as illustrated in FIG. 34.

Figure 35:
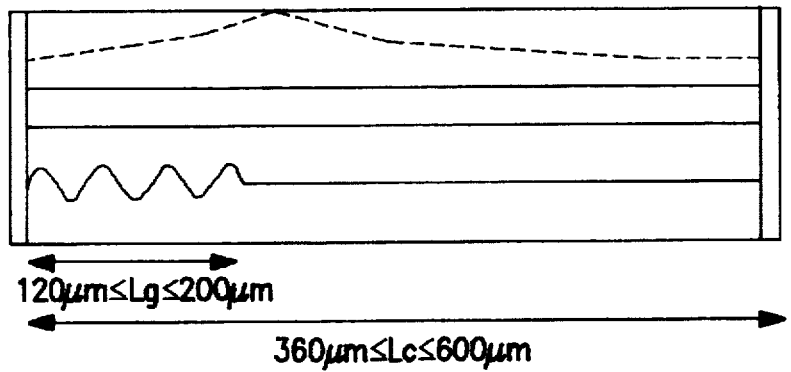

It is also available that the InGaAsP optical guide layer has a constant energy band gap corresponding to a wavelength composition in the range of 1.04–1.08 micrometers, wherein the grating length is in the range of 120–200 micrometers, wherein the averaged amplitude value is in the range of 200–240 angstroms, and wherein the cavity length is in the range of 360–600 micrometers as illustrated in FIG. 35.

Figure 36:
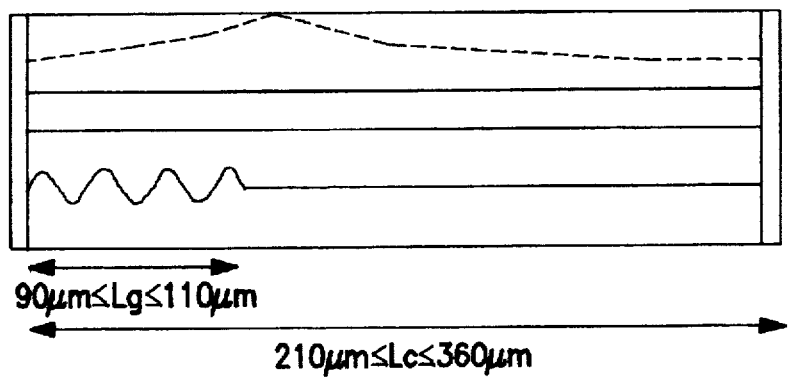

It is also available that the InGaAsP optical guide layer has a constant energy band gap corresponding to a wavelength composition in the range of 1.05–1.07 micrometers, wherein the grating length is in the range of 90–110 micrometers, wherein the averaged amplitude value is in the range of 240–260 angstroms, and wherein the cavity length is in the range of 210–360 micrometers as illustrated in FIG. 36.

Figure 37:
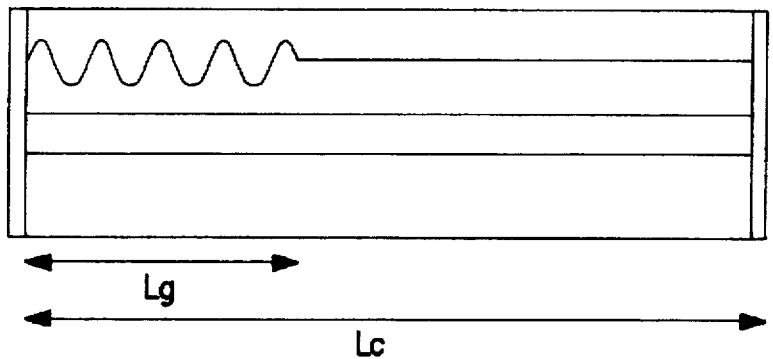

If a grating is provided on an interface between a cladding, layer and an optical guide layer which is provided under the cladding layer and over the active layer, it may be available that the InGaAsP optical guide layer has a constant energy band gap corresponding to a wavelength composition of lees than 1.10 micrometers, and that the grating structure has an averaged amplitude value not less than 260 angstroms as illustrated in FIG. 37, provided that the averaged amplitude value is obtained by dividing an integrated value by the grating length, and provided that the integrated value is obtained by integrating amplitude of the grating structure with positions in the cavity direction.

Figure 38:
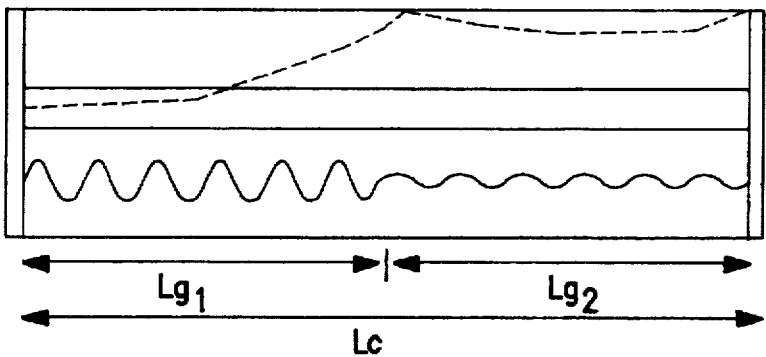
Figure 39:
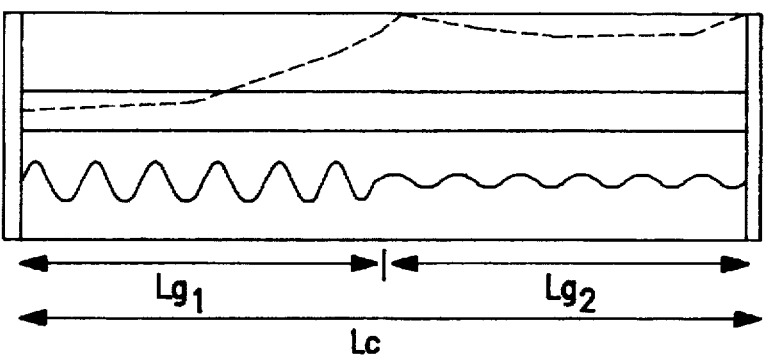

The present invention provides another grating structure provided in a semiconductor laser device having a first facet of a first reflectivity and a second facet of a second reflectivity being larger than the first reflectivity. The grating structure comprises a first grating structure extending over a first half area near the first facet and a second grating structure extending over a second half area near the second facet. The first grating structure on the first half area has a first averaged coupling coefficient obtained by dividing a first integrated value by a length of the first half area in the cavity direction, where the first integrated value is obtained by integrating coupling coefficients of the first grating structure on the first half area with positions along the cavity direction. The second grating structure on the second half area has a second averaged coupling coefficient smaller than the first averaged coupling coefficient. The second averaged coupling coefficient is obtained by dividing a second integrated value by a length of the second half area in the cavity direction, where the second integrated value is obtained by integrating coupling coefficients of the second grating structure on the second half area with positions along the cavity direction as illustrated in FIG. 38. In this case, normally the first averaged coupling coefficient of the first grating is larger than the second averaged coupling coefficient of the second grating as illustrated in FIG. 39.

The above condition of that second averaged coupling coefficient of the second gating structure is smaller than the first averaged coupling coefficient of the first grating structure is essential for obtaining a relatively flat distribution in the intensity of the electric field. The grating is capable of reflecting a light as electromagnetic field wave or wave packet at a probability. The probability of the reflection of the light or photons depends both on the magnitude of coupling coefficient and on the length of grating. More precisely, this reflection probability depends on the integrated value obtained by integrating the coupling coefficient with positions in the cavity direction. Accordingly, the first grating, which is provided in the side of the first facet and has the first averaged coupling coefficient larger than the second averaged coupling coefficient of the second grating provided in the side of the second facet, is thus capable of shifting the distribution in the intensity of the electric field toward the second facet. If the first averaged coupling coefficient is the same as the second averaged coupling coefficient of the second grating, the distribution in the intensity of the electric field may be relatively flat or may have almost no or extremely small variation. Further, the intensity of the electric field has a maximum value at a position distanced from both the first and second facets. Namely, the first coupling coefficient of the first grating structure is larger than the second coupling coefficient of the second grating structure. This means that the first grating structure provides a larger reflection probability than the second grating structure. This causes a shift of the intensity distribution of the electric field toward the second facet. This compensates the difference in light reflexivity between the first and second grating structures. As a result, a relatively flat distribution in the intensity of the electric field can be obtained. Such relatively flat distribution in the intensity of the electric field may have a maximum value at any position in an intermediate region distanced from both the first and second facets.

When the laser device is used for an optical CATV, then it is required that the degree of the flatness of the electric field intensity distribution is sufficiently large for obtaining almost no or extremely small intermodulation distortions in the second and third orders. If the degree of the flatness of the electric field intensity distribution is sufficiently large for obtaining almost no or extremely small intermodulation distortions in the second and third orders, this means that the luminescence intensity of the laser device is linearly or proportionally varied over injection current values. Namely, such desirable property of luminescence intensity is, therefore, required to obtain almost no or extremely small intermodulation distortions in the second and third orders. This is the primary requirement. A secondary requirement is to keep a high yield of the laser device. Even if the above first requirement for obtaining almost no or extremely small intermodulation distortions in the second and third orders is satisfied, a low yield of the laser device is undesirable.

In consideration of the above, it was confirmed by the inventor of the present invention that, in order to satisfy the above first and second requirements, namely to obtain both the required proportional variation in the luminescence intensity and a relatively high yield, it is required to satisfy at least the following condition. The essential condition is that the first averaged coupling coefficient of the first grating structure be larger than the second averaged coupling coefficient of the second grating structure, wherein the averaged coupling coefficient is obtained by dividing an integrated value by a length of the grating in the cavity direction provided this integrated value is obtained by integrating coupling coefficient of the grating structure with positions along the cavity direction as illustrated in FIG. 38.

It is available that the first grating structure comprises a first single grating which continuously extends on the first half area from the first facet toward a center of the semiconductor laser device, and that the second grating structure comprises a second single grating which continuously extends on the second half area from the first facet toward a center of the semiconductor laser device. In this case, the first single grating may have a first constant amplitude, and the second single grating may have a second constant amplitude.

In place of the first and second constant amplitudes of the first and second gratings, it is also available that the first single grating may have first amplitudes which are continuously varied over positions in the cavity direction, and that the second single grating may have second amplitudes which are continuously varied over positions in the cavity direction. For example, the first amplitudes are linearly varied over positions in the cavity direction, and the first amplitudes are linearly varied over positions in the cavity direction. More concretely, the first amplitudes are proportionally increased toward the first facet, and the second amplitudes are proportionally increased toward the second facet. Alternatively, the first amplitudes may be proportionally decreased toward the first facet, and the second amplitudes may be proportionally decreased toward the second facet. Alternatively, the first amplitudes may be proportionally increased toward the first facet, and the second amplitudes may be proportionally decreased toward the second facet. Alternatively, the first amplitudes may be proportionally decreased toward the first facet, and the second amplitudes may be proportionally increased toward the second facet.

In place of the linear variation in the first and second amplitudes of the first and second gratings, it may be available that the first amplitudes are non-linearly varied over positions in the cavity direction, and wherein the second amplitudes are non-linearly varied over positions in the cavity direction.

In place of the continuous variations in the first and second amplitudes of the first and second gratings, it may be available that the first single grating has first amplitudes which are discontinuously varied over positions in the cavity direction, and that the second single grating has second amplitudes which are discontinuously varied over positions in the cavity direction. In this case, the first amplitudes may comprise a first set of different amplitudes, and the second amplitudes may comprise a second set of different amplitudes. More concretely, the first set of amplitudes may comprise a first amplitude and a second amplitude larger than the first amplitude. The first grating may have the first amplitude on a first region near the first facet, and has the second amplitude on a second region apart from the first facet. The second set of amplitudes may comprise a third amplitude and a fourth amplitude larger than the third amplitude. The second grating has the third amplitude on a third region near the second facet, and has the fourth amplitude on a fourth region apart from the second facet. Alternatively, the first set of amplitudes may comprise a first amplitude and a second amplitude larger than the first amplitude. The first grating has the second amplitude on a first region near the first facet, and has the first amplitude on a second region apart from the first facet. The second set of amplitudes may comprise a third amplitude and a fourth amplitude larger than the third amplitude. The second grating has the fourth amplitude on a third region near the second facet, and the second grating has the third amplitude on a fourth region apart from the second facet.

Moreover, it is available that the first grating structure may comprise a first single grating which is distanced from the first facet and continuously extends toward a center of the semiconductor laser device, and that the second grating structure may comprise a second single grating which is distanced from the second facet and continuously extends toward a center of the semiconductor laser device. In this case, the first single grating may have a first constant amplitude, and the second single grating has a second constant amplitude. In place of the first and second constant amplitudes of the first and second gratings, the first single grating has first amplitudes which are continuously varied over positions in the cavity direction, and the second single grating has second amplitudes which are continuously varied over positions in the cavity direction. In this case, the first amplitudes may be linearly varied over positions in the cavity direction, and the first amplitudes are linearly varied over positions in the cavity direction. For example, the first amplitudes are proportionally increased toward the first facet, and the second amplitudes are proportionally increased toward the second facet. Alternatively, the first amplitudes may be proportionally decreased toward the first facet, and the second amplitudes may be proportionally decreased toward the second facet. For example, the first amplitudes are proportionally increased toward the first facet, and the second amplitudes are proportionally decreased toward the second facet. Alternatively, it is available that the first amplitudes are proportionally decreased toward the first facet, and that the second amplitudes are proportionally increased toward the second facet. In place of the linear variations in the first and second amplitudes of the first and second gratings, it is also available that the first amplitudes are non-linearly varied over positions in the cavity direction, and that the second amplitudes are non-linearly varied over positions in the cavity direction.

In place of the continuous variations in the first and second amplitudes of the first and second gratings, it may be available that the first single grating has first amplitudes which are discontinuously varied over positions in the cavity direction, and that the second single grating has second amplitudes which are discontinuously varied over positions in the cavity direction. In this case, it is available that the first amplitudes comprise a first set of different amplitudes, and that the second amplitudes comprise a second set of different amplitudes.

More concretely, it is available that the first set of amplitudes comprises a first amplitude and a second amplitude larger than the first amplitude. The first grating has the first amplitude on a first region near the first facet. The first grating has the second amplitude on a second region apart from the first facet. The second set of amplitudes comprises a third amplitude and a fourth amplitude larger than the third amplitude. The second grating has the third amplitude on a third region near the second facet. The second grating has the fourth amplitude on a fourth region apart from the second facet.

Alternatively, it is also available that the first set of amplitudes comprises a first amplitude and a second amplitude larger than the first amplitude. The first grating has the second amplitude on a first region near the first facet. The first grating has the first amplitude on a second region apart from the first facet. The second set of amplitudes comprises a third amplitude and a fourth amplitude larger than the third amplitude. The second grating has the fourth amplitude on a third region near the second facet. The second grating has the third amplitude on a fourth region apart from the second facet.

In place of the first grating continuously extending from the first facet, it may be also available that the first grating structure comprises a first set of gratings which discontinuously extend from the first facet toward a center of the semiconductor laser device, and that the second grating structure comprises a second set of gratings which discontinuously extend from the second facet toward a center of the semiconductor laser device. In this case, it is, for example, available that the first grating structure comprises a first grating which continuously extends from the first facet, and a second grating which is distanced from the first grating and continuously extends toward a center of the semiconductor laser device, and also available that the second grating structure comprises a third grating which continuously extends from the second facet, and a fourth grating which is distanced from the third grating and continuously extends toward a center of the semiconductor laser device. More concretely, it is available that the first set of gratings has a first constant amplitude, and that the second set of gratings has a second constant amplitude.

Alternatively, it is available that the first set of gratings has first amplitudes which are continuously varied over positions in the cavity direction, and that the second set of gratings has second amplitudes which are continuously varied over positions in the cavity direction. In this case, it is, for example, available that the first amplitudes are linearly varied over positions in the cavity direction, and that the second amplitudes are linearly varied over positions in the cavity direction. It is more concretely available that the first amplitudes are proportionally increased toward the first facet, and that the second amplitudes are proportionally increased toward the second facet. Alternatively, it is also available that the first amplitudes are proportionally decreased toward the first facet, and that the first amplitudes are proportionally decreased toward the second facet. Alternatively, it is also available that the first amplitudes are proportionally increased toward the first facet, and that the second amplitudes are proportionally decreased toward the second facet. Alternatively, it is also available that the first amplitudes are proportionally decreased toward the first facet, and that the first amplitudes are proportionally increased toward the second facet.

In place of the linear variations in the first and second amplitudes of the first and second gratings, it is available that the first amplitudes are non-linearly varied over positions in the cavity direction, and that the second amplitudes are non-linearly varied over positions in the cavity direction.

In place of the continuous variations in the first and second amplitudes or the first and second gratings, it is available that the first set of gratings has first amplitudes which are discontinuously varied over positions in the cavity direction, and that the second set of gratings has second amplitudes which are discontinuously varied over positions in the cavity direction. In this case, it is for example available that the first amplitudes comprise a first set of different amplitudes, and that the second amplitudes comprise a second set of different amplitudes.

In place of the first grating extending from the first facet and the second grating continuously extending from the first grating, it is available that the first grating structure comprises a first set of gratings which are distanced from the first facet and discontinuously extend toward a center of the semiconductor laser device, and that The second grating structure comprises a second set of gratings which are distanced from the second facet and discontinuously extend toward a center of the semiconductor laser device. In this case, it is for example available that the first grating structure comprises a first gating which is distanced from the first facet and a second grating which is distanced from the first grating and continuously extends toward a center of the semiconductor laser device, and also that the second grating structure comprises a third grating which is distanced from the second facet and a fourth grating which is distanced from the third grating and continuously extends toward a center of the semiconductor laser device. It is more concretely available that the first set of gratings has a first constant amplitude, and wherein the second set of gratings has a second constant amplitude. Alternatively, it is concretely available that the first set of gratings has first amplitudes which are continuously varied over positions in the cavity direction, and that the second set of gratings has second amplitudes which are continuously varied over positions in the cavity direction. In this case, it is more concretely available that the first amplitudes are linearly varied over positions in the cavity direction, and that the second amplitudes are linearly varied over positions in the cavity direction. Furthermore, in this case, it is for example available that the first amplitudes are proportionally increased toward the first facet, and that the second amplitudes are proportionally increased toward the second facet. Alternatively, it is for example available that the first amplitudes are proportionally decreased toward the first facet, and that the first amplitudes are proportionally decreased toward the second facet. Alternatively, it is for example available that the first amplitudes are proportionally increased toward the first facet, and that the second amplitudes are proportionally decreased toward the second facet. Alternatively, it is for example available that the first amplitudes are proportionally decreased toward the first facet, and that the first amplitudes are proportionally increased toward the second facet.

In place of linear variations in the first and second amplitude of the first and seconded gratings which are discontinuously extends, it is also available that the first amplitudes are non-linearly varied over positions in the cavity direction, and that the second amplitudes are non-linearly varied over positions in the cavity direction.

In place of continuous variations in the first and second amplitude of the first and second gratings which are discontinuously extends, it is also available that the first set of gratings has first amplitudes which are discontinuously varied over positions in the cavity direction, and that the second set of gratings has second amplitudes which are discontinuously varied over positions in the cavity direction. In this case, it is for example available that the first amplitudes comprise a first set of different amplitudes, and that the second amplitudes comprise a second set of different amplitudes.

Provided that the second averaged coupling coefficient is smaller than the first averaged coupling coefficient, it is available that the first and second grating structures are provided on an interface between an InP layer and an InGaAsP optical guide layer, and also available that the first grating structure has a first averaged amplitude value of 220 angstroms. The second grating structure has a second averaged amplitude value of 100 angstroms. Each of the first and second averaged amplitude values is obtained by dividing an integrated value by the grain length. The integrated value is obtained by integrating amplitude of the grating structure with positions in the cavity direction.

The present invention further provides a semiconductor laser device having a first facet of a first reflectivity and a second facet of a second reflectivity being larger than the first reflectivity. The laser device comprises the following elements. A semiconductor substrate is made of InP. An optical guide layer is provided on the semiconductor substrate. The optical guide layer is made of InGaAsP. An active layer is provided on the optical guide layer. A grating structure is partially provided on an interface between the semiconductor substrate and the optical guide layer. The grating structure extends within a half area near the first facet. As illustrated in FIG. 11, the grating structure has a gating length in a cavity direction of not more than one third of a cavity length defined as a distance between the first and second facets. The grating structure further has an integrated coupling coefficient value in the range of 0.4–0.6, wherein the integrated coupling coefficient value is obtained by integrating coupling coefficient of the grating structure with positions in the cavity direction.

The above conditions of that the integrated coupling coefficient value of the grating structure in the range of 0.4–0.6 and that the grating length are essential for obtaining a relatively flat distribution in the intensity of the electric field. The grating is capable of reflecting a light as electromagnetic field wave or wave packet at a probability. The probability of the reflection of the light or photons depends both on the coupling coefficient and on the length of grating. More precisely, this reflection probability depends on the integrated value obtained by integrating the coupling coefficient with positions in the cavity direction. Such grating provided in the side of the first facet having the smaller reflectivity than the second reflectivity is thus capable of shifting the distribution in the intensity of the electric field toward the second facet. If no grating is provided, then the distribution in the intensity of the electric field has a large variation, wherein the intensity of the electric field is simply increased toward the first facet having the smaller reflectivity than the second facet. Further, the intensity of the electric field has a maximum value at the first facet and a minimum value at the second facet, wherein a difference between the maximum value and the minimum value is sufficiently large for allowing that the intensity of the luminescence of the laser device versus the injection current is non-linearly varied. Such non-linear variation, in the intensity of the luminescence of the laser device causes the problem with the considerable intermodulation distortion as described in the background of the invention. If, however, the grating showing the light reflecting performance is provided in the side of the first facet, then the light may be reflected by either the grating or the first facet. The grating increases the probability of the reflection of the light in the first facet side toward the direction of the second facet side. For this reason, the grating provided in the first facet side causes a shift of the distribution in the intensity of the electric field, so as to reduces the difference between the maximum and minimum values, namely to change the largely varied distribution in the intensity of the electric field into a relatively flat distribution in the intensity of the electric field. Such relatively flat distribution in the intensity of the electric field may have a maximum value at any position in an intermediate region distanced from both the first and second facets. When the laser device is used for an optical CATV, it is, however, required that the degree of the flatness of the electric field intensity distribution is sufficiently large for obtaining almost no or extremely small intermodulation distortions in the second and third orders. If the degree of the flatness of the electric field intensity distribution is sufficiently large for obtaining almost no or extremely small intermodulation distortions in the second and third orders, this means that the luminescence intensity of the laser device is linearly or proportionally varied over injection current values. Namely, such desirable property of luminescence intensity is, therefore, required to obtain almost no or extremely small intermodulation distortions in the second and third orders. This is the first requirement. A secondary requirement is to keep a high yield of the laser device. Even of the above first requirement for obtaining almost no or extremely small intermodulation distortions in the second and third orders is satisfied, a low yield of the laser device is undesirable.

In consideration of the above, it was confirmed by the inventor of the present invention that, in order to satisfy the above first and second requirements, namely to obtain both the required proportional variation in the luminescence intensity and a relatively high yield, it is required to satisfy at least the following two conditions. The first essential condition is that the integrated coupling coefficient value obtained by integrating coupling coefficient of the grating with positions in the cavity direction is in the range of 0.4–0.6. The second essential condition is that the length in the cavity direction of the grating be within one third of the cavity length which is defined as a distance between the first and second facets having the individual reflectivities.

Further, in order to obtain improvements both in yield of the laser device and the degree of flatness of the electric field intensity distribution, it is required to further satisfy, as illustrated in FIG. 5, the third condition that an averaged amplitude of grating is in the range of 200–260 angstroms, wherein the averaged amplitude of grating is calculated by dividing, by a length of grating, an integrated value which is obtained by integrating amplitude of the grating with positions in the cavity direction. FIG. 5 illustrates that if the above first, second and third conditions are satisfied, then it is caused that an electric field intensity distribution is sufficiently flat for obtaining almost no or extremely small intermodulation distortions in the second and third orders. However, even if the essential first and second conditions only are satisfied but the third condition is not satisfied, it is also caused that an electric field intensity distribution is sufficiently flat for obtaining almost no or extremely small intermodulation distortions in the second and third orders, whereas the yield may be lower than when the first, second and third conditions are satisfied.

It is available to further provide an InP cladding layer extending over the active layer.

Alternatively, it is also available to further provide an additional optical guide layer extending over the active layer, an InP cladding layer extending over the additional optical guide layer, and an additional grating structure being partially provided on an interface between the InP cladding layer and the additional optical guide layer. The grating structure extends within the half area. The additional grating structure has a grating length in the cavity direction of not more than one third of the cavity length, and has an integrated coupling coefficient value in the range of 0.4–0.6, where the integrated coupling coefficient value is obtained by integrating coupling coefficient of the grating structure with positions in the cavity direction.

It is preferable that the cavity length is in the range of 200–600 micrometers.

It is preferable that the grating structure is provided on an interface between an InP layer and an InGaAsP optical guide layer, and that the grating structure has an averaged amplitude value in the range of 200 to 260 angstroms as illustrated in FIG. 11, where the averaged amplitude value is obtained by dividing an integrated value by the grating length, and the integrated value is obtained by integrating amplitude of the grating structure with positions in the cavity direction.

It is preferable that the InGaAsP optical guide layer has a thickness in the range of 800–1200 angstroms.

As illustrated in FIG. 29, it is also preferable that the InGaAsP optical guide layer has a constant energy band gap corresponding to a wavelength composition in the range of 1.12–1.16 micrometers, and that the grating length is in the range of 40–100 micrometers.

As illustrated in FIG. 30, it is also preferable that the InGaAsP optical guide layer has a constant energy band gap corresponding to a wavelength composition in the range of 1.13–1.15 micrometers, that the grating length is in the range of 40–100 micrometers, and that the averaged amplitude value is in the range of 220–240 angstroms.

As illustrated in FIG. 31, it is also preferable that the InGaAsP optical guide layer has a constant energy band gap corresponding to a wavelength composition in the range of 1.08–1.12 micrometers, that the grating length is in the range of 50–120 micrometers, that the averaged amplitude value is in the range of 220–260 angstroms, and that the cavity length is in the range of 200–360 micrometers.

As illustrated in FIG. 32, it is also preferable that the InGaAsP optical guide layer has a constant energy band gap corresponding to a wavelength composition in the range of 1.08–1.12 micrometers, that the grating length is in the range of 120–140 micrometers, that the averaged amplitude value is in the range of 200–220 angstroms, and that the cavity length is in the range of 360–420 micrometers.

As illustrated in FIG. 33, it is also preferable that the InGaAsP optical guide layer has a constant energy band gap corresponding to a wavelength composition in the range of 1.09–1.11 micrometers, that the grating length is in the range of 90–110 micrometers, that the averaged amplitude value is in the range of 220–240 angstroms, and that the cavity length is in the range of 360–420 micrometers.

As illustrated in FIG. 34, it is also preferable that the InGaAsP optical guide layer has a constant energy band gap corresponding to a wavelength composition in the range of 1.04–1.08 micrometers, that the grating length is in the range of 70–120 micrometers, that the averaged amplitude value is in the range of 240–260 angstroms, and that the cavity length is in the range of 210–360 micrometers.

As illustrated in FIG. 35, it is also preferable that the InGaAsP optical guide layer has a constant energy band gap corresponding to a wavelength composition in the range of 1.04–1.08 micrometers, that the grating length is in the range of 120–200 micrometers, that the averaged amplitude value is in the range of 200–240 angstroms, and that the cavity length is in the range of 360–600 micrometers.

As illustrated in FIG. 36, it is also preferable that the InGaAsP optical guide layer has a constant energy land gap corresponding to a wavelength composition in the range of 1.05–1.07 micrometers, that the grating length is in the range of 90–110 micrometers, that the averaged amplitude value is in the range of 240–260 angstroms, and that the cavity length is in the range of 210–360 micrometers.

The present invention further more provides another semiconductor laser device having a first facet of a first reflectivity and a second facet of a second reflectivity being larger than the first reflectivity. The laser device comprises the following elements. A semiconductor substrate is made of InP. An active layer is provided on the semiconductor substrate. An optical guide layer is provided on the active layer. The optical guide layer is made of InGaAsP. An InP cladding layer extends over the optical guide layer. A grating structure is partially provided on an interface between the InP cladding layer and the optical guide layer. The grating structure extends within a half area near the first facet. The grating structure has a grating length in a cavity direction of not more than one third of a cavity length defined as a distance between the first and second facets. The grating structure has an integrated coupling coefficient value in the range of 0.4–0.6, where the integrated coupling coefficient value is obtained by integrating coupling coefficient of the grating structure with positions in the cavity direction.

As illustrated in FIG. 37, it is also preferable that the InGaAsP optical guide layer has a constant energy band gap corresponding to a wavelength composition of lees than 1.10 micrometers, and that the grating structure has an averaged amplitude value not less than 260 angstroms, where the averaged amplitude value is obtained by dividing an integrated value by the grating length, and the integrated value is obtained by integrating amplitude of the grating structure with positions in the cavity direction.

The present invention also provides still another semiconductor laser device having a first facet of a first reflectivity and a second facet of a second reflectivity being larger than the first reflectivity. The laser device comprises the following elements. A semiconductor substrate is made of InP. An optical guide layer is provided on the semiconductor substrate. The optical guide layer is made of InGaAsP. An active layer is provided on the optical guide layer. A grating structure is provided on an interface between the semiconductor substrate and the optical guide layer. The grating structure comprises a first grating structure extending over a first half area near the first facet and a second grating structure extending over a second half area near the second facet. The first grating structure on the first half area has a first averaged coupling coefficient obtained by dividing a first integrated value by a length of the first half area in the cavity direction. The first integrated value is obtained by integrating coupling coefficients of the grating structure on the first half area with positions along the cavity direction. The second grating structure on the second half area also has a second averaged coupling coefficient smaller than the first averaged coupling coefficient. The second averaged coupling coefficient is obtained by dividing a second integrated value by a length of the second half area in the cavity direction. The second integrated value is obtained by integrating coupling coefficients of the grating structure on the second half area with positions along the cavity direction as illustrated in FIG. 38. In this case, normally the first averaged coupling coefficient of the first grating is larger than the second averaged coupling coefficient of the second grating as illustrated in FIG. 39.

The above condition of that second averaged coupling coefficient of the second grating structure is smaller than the first averaged coupling coefficient of the first grating structure is essential for obtaining a relatively flat distribution in the intensity of the electric field. The grating is capable of reflecting a light as electromagnetic field wave or wave packet at a probability. The probability of the reflection of the light or photons depends both on the magnitude of coupling coefficient and on the length of grating. More precisely, this reflection probability depends on the integrated value obtained by integrating the coupling coefficient with positions in the cavity direction. Accordingly, the first grating, which is provided in the side of the first facet and has the first averaged coupling coefficient larger than the second averaged coupling coefficient of the second grating provided in the side of the second facet, is thus capable of shifting the distribution in the intensity of the electric field toward the second facet. If the first averaged coupling coefficient is the same as the second averaged coupling coefficient of the second grating, the distribution in the intensity of the electric field may be relatively flat or may have almost no or extremely small variation. Further, the intensity of the electric field has a maximum value at a position distanced from both the first and second facets. Namely, the first coupling coefficient of the first grating structure is larger than the second coupling coefficient of the second grating structure. This means that the first grating structure provides a larger reflection probability than the second grating structure. This causes a shift of the intensity distribution of the electric field toward the second facet. This compensates the difference in light reflectivity between the first and second grating structures. As a result, a relatively flat distribution in the intensity of the electric field can be obtained. Such relatively flat distribution in the intensity of the electric field may have a maximum value at any position in an intermediate region distanced from both the first and second facets.

When the laser device is used for an optical CATV, then it is required that the degree of the flatness of the electric field intensity distribution is sufficiently large for obtaining almost no or extremely small intermodulation distortions in the second and third orders. If the degree of the flatness of the electric field intensity distribution is sufficiently large for obtaining almost no or extremely small intermodulation distortions in the second and third orders, this means that the luminescence intensity of the laser device is linearly or proportionally varied over injection current values. Namely, such desirable property of luminescence intensity is, therefore, required to obtain almost no or extremely small intermodulation distortions in the second and third orders. This is the primary requirement. A secondary requirement is to keep a high yield of the laser device. Even if the above first requirement for obtaining almost no or extremely small intermodulation distortions in the second and third orders is satisfied, a low yield of the laser device is undesirable.

In consideration of the above, it was confirmed by the inventor of the present invention that, in order to satisfy the above first and second requirements, namely to obtain both the required proportional variation in the luminescence intensity and a relatively high yield, it is required to satisfy at least the following condition. The essential condition is that the first averaged coupling coefficient of the first grating structure be larger than the second averaged coupling, coefficient of the second grating structure, wherein the averaged coupling coefficient is obtained by dividing an integrated value by a length of the grating in the cavity direction provided this integrated value is obtained by integrating coupling coefficient of the grating structure with positions along the cavity direction as illustrated in FIG. 38.

Figure 40:
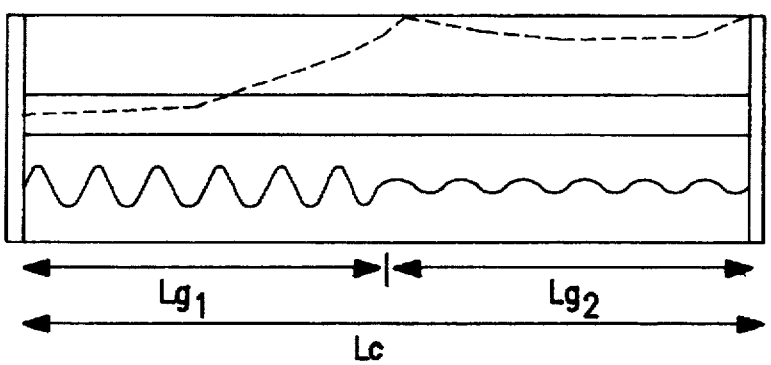

As illustrated in FIG. 40, it is preferable that the first and second grating structures are provided on an interface between an InP layer and an InGaAsP optical guide layer, and that the first grating structure has a first averaged amplitude value of 220 angstroms, and further that the second grating structure has a second averaged amplitude value of 100 angstroms. Each of the first and second averaged amplitude values is obtained by dividing an integrated value by the grating length, where the integrated value is obtained by integrating amplitude of the grating structure with positions in the cavity direction.

It is also preferable to further provide an InP cladding layer extending over the active layer.

Alternatively, it is also preferable to provide an additional optical guide layer extending over the active layer, an InP cladding layer extending over the additional optical guide layer, and an additional grating structure being provided on an interface between the semiconductor substrate and the optical guide layer. The additional grating structure comprises a third grating structure extending over a first half area near the first facet and a fourth grating structure extending over a second half area near the second facet. The third grating structure on the first half area has a third averaged coupling coefficient obtained by dividing a third integrated value by a length of the first half area in the cavity direction, where the third integrated value is obtained by integrating coupling coefficients of the third grating structure on the first half area with positions along the cavity direction. The fourth grating structure on the second half area has a fourth averaged coupling coefficient smaller than the third averaged coupling coefficient. The fourth averaged coupling coefficient is obtained by dividing a fourth integrated value by a length of the second half area in the cavity direction, where the fourth integrated value is obtained by integrating coupling coefficients of the fourth grating structure on the second half area with positions along the cavity direction. In this case, it is more concretely available that the third and fourth grating structures are provided on an interface between an InP layer and an InGaAsP optical guide layer. The third grating structure has a third averaged amplitude value of 220 angstroms. The fourth grating structure has a fourth averaged amplitude value of 100 angstroms. Each of the third and fourth averaged amplitude, values is obtained by dividing an integrated value by the grating length, the integrated value being obtained by integrating amplitude of the third and fourth grating structures respectively with positions in the cavity direction.

Figure 41:
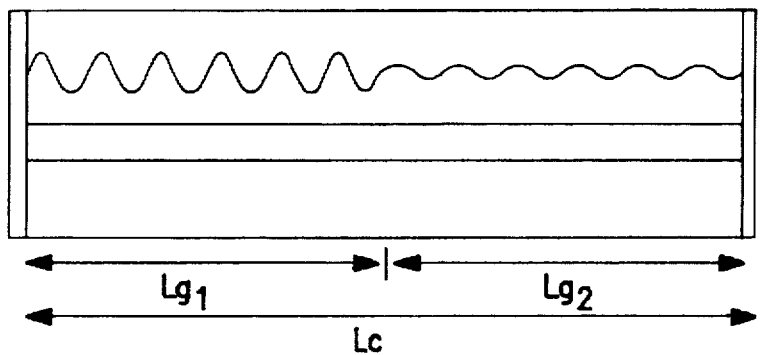

The present invention also provides still another semiconductor laser device having a first facet of a first reflectivity and a second facet of a second reflectivity being larger than the first reflectivity. The laser device comprises the following elements. A semiconductor substrate is made of InP. An active layer is provided on the semiconductor substrate. An optical guide layer is provided on the active layer. The optical guide layer is made of InGaAsP. An InP cladding layer extends over the optical guide layer. A grating structure is provided on an interface between the InP cladding layer and the optical guide layer. The grating structure comprises a first grating structure extending over a first half area near the first facet and a second grating structure extending over a second half area near the second facet. The first grating structure on the first half area has a first averaged coupling coefficient obtained by dividing a first integrated value by a length of the first half area in the cavity direction. The first integrated value is obtained by integrating coupling coefficients of the first grating structure on the first half area with positions along the cavity direction. The second grating structure on the second half area has a second averaged coupling coefficient smaller than the first averaged coupling coefficient. The second averaged coupling coefficient is obtained by dividing a second integrated value by a length of the second half area in the cavity direction. The second integrated value is obtained by integrating coupling coefficients of the second gating structure on the second half area with positions along the cavity direction as illustrated in FIG. 41. In this case, normally the first averaged coupling coefficient of the first grating is larger than the second averaged coupling coefficient of the second grating as illustrated in FIG. 41.

The above condition of that second averaged coupling coefficient of the second grating structure is smaller than the first averaged coupling coefficient of the first grating structure is essential for obtaining a relatively flat distribution in the intensity of the electric field. The grating is capable of reflecting a light as electromagnetic field wave or wave packet at a probability. The probability of the reflection of the light or photons depends both on the magnitude of coupling coefficient and on the length of grating. More precisely, this reflection probability depends on the integrated value obtained by integrating the coupling coefficient with positions in the cavity direction. Accordingly, the first grating, which is provided in the side of the first facet and has the first averaged coupling coefficient larger than the second averaged coupling coefficient of the second grating provided in the side of the second facet, is thus capable of shifting the distribution in the intensity of the electric field toward the second facet. If the first averaged coupling coefficient is the same as the second averaged coupling coefficient of the second grating, the distribution in the intensity of the electric field may be relatively flat or may have almost no or extremely small variation. Further, the intensity of the electric field has a maximum value at a position distanced from both the first and second facets. Namely, the first coupling coefficient of the first grating structure is larger than the second coupling coefficient of the second grating structure. This means that the first grating structure provides a larger reflection probability than the second grating structure. This causes a shift of the intensity distribution of the electric field toward the second facet. This compensates the difference in light reflectivity between the first and second grating structures. As a result, a relatively flat distribution in the intensity of the electric field can be obtained. Such relatively flat distribution in the intensity of the electric field may have a maximum value at any position in an intermediate region distanced from both the first and second facets.

When the laser device is used for an optical CATV, then it is required that the degree of the flatness of the electric field intensity distribution is sufficiently large for obtaining almost no or extremely small intermodulation distortions in the second and third orders. If the degree of the flatness of the electric field intensity distribution is sufficiently large for obtaining almost no or extremely small intermodulation distortions in the second and third orders, this means that the luminescence intensity of the laser device is linearly or proportionally varied over injection current values. Namely, such desirable property of luminescence intensity is, therefore, required to obtain almost no or extremely small intermodulation distortions in the second and third orders. This is the primary requirement. A secondary requirement is to keep a high yield of the laser device. Even if the above first requirement for obtaining almost no or extremely small intermodulation distortions in the second and third orders is satisfied, a low yield of the laser device is undesirable.

In consideration of the above, it was confirmed by the inventor of the present invention that, in order to satisfy the above first and second requirements, namely to obtain both the required proportional variation in the luminescence intensity and a relatively high yield, it is required to satisfy at least the following condition. The essential condition is that the first averaged coupling coefficient of the first grating structure be larger than the second averaged coupling coefficient of the second grating structure, wherein the averaged coupling coefficient is obtained by dividing an integrated value by a length of the grating in the cavity direction provided this integrated value is obtained by integrating coupling coefficient of the grating structure with positions along the cavity direction as illustrated in FIG. 41. In this case, even if the grating amplitude is so large, the optical guide layer is free from the problems with deterioration of performance, which are caused by failure to have a sufficient flatness. As a result, a high yield of this laser device can easily obtained.

Figure 42:
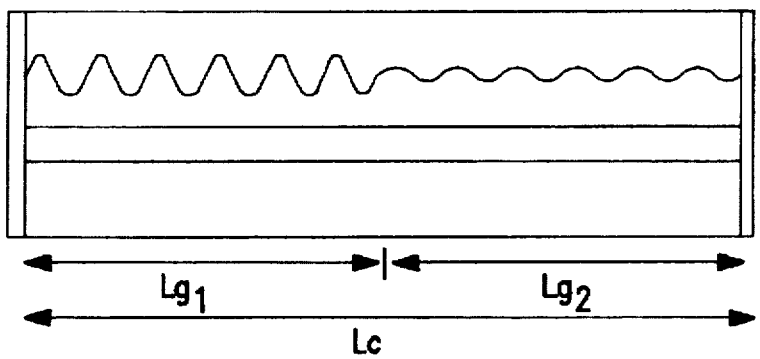

In the above case, it is, for example, available as illustrated in FIG. 42 that the first and second grating structures are provided on an interface between an InP layer and an InGaAsP optical guide layer. The first grating structure has a first averaged amplitude value, of 220 angstroms. The second grating structure has a second averaged amplitude value of 100 angstroms. Each of the first and second averaged amplitude values is obtained by dividing an integrated value by the grating length. The integrated value is obtained by integrating amplitude of the grating structure with positions in the cavity direction.

PREFERRED EMBODIMENTS

Preferred embodiments of the present invention will hereinafter be described in detail with reference to the accompanying drawings.

A first embodiment according to the present invention will be described with reference to FIGS. 43 and 44A through 44E. A distributed feed back laser is provided, which has a cavity length of 300 micrometers. The distributed feed back laser has a first facet 2 of a first reflectivity of 1% and a second facet 3 of a second reflectivity of 90%. A grating 1 is selectively formed on a surface of an n-InP substrate 7. The grating has a length of 70 micrometers and an amplitude in the range of 230–240 angstroms. The grating 1 has a coupling coefficient of 70 $cm^{-1}$.

An n-InGaAsP optical guide layer 5 of a wavelength component of 1.13 micrometers is formed on the surface of the substrate 1 having the grating 16. A multiple quantum well active layer 4 is formed on the n-InGaAsP optical guide layer 5. The multiple quantum well active layer 4 comprises 10 periods of laminations of quantum well layers and potential barrier layers. The quantum well layer has a wavelength composition of 1.4 micrometers and a thickness of 62 angstroms. The potential barrier layer has a wavelength composition of 1.05 micrometers and a thickness of 100 angstroms. The 10 periods of laminations of quantum well layers and potential barrier layers is sandwiched between first and second SCH layers of a wavelength composition of 1.05 micrometers. The first SCH layer is positioned in the p-side and having a thickness of 600 angstroms. The second SCH layer is positioned in the n-side and having a thickness of 300 angstroms. A p-InP cladding layer having a thickness of about 0.5 micrometers is formed on the multiple quantum well active layer 4.

The distributed feed back laser is tested. The third intermodulation distortion was measured by two signals in the frequency band of 1.5 GHz. Under the optical output of 5 mW from an optical fiber and 20% modulation, the measured third intermodulation distortion was −84 dBc. The yield of the above laser was 30% under the condition that the third intermodulation distortion is equal to or less than −80 dBc. By contrast, the conventional laser exhibited the third intermodulation distortion of −81 dBc. The yield of the conventional laser was 30% under the condition that the third intermodulation distortion is equal to or less than 80 dBc.

Figure 44A:
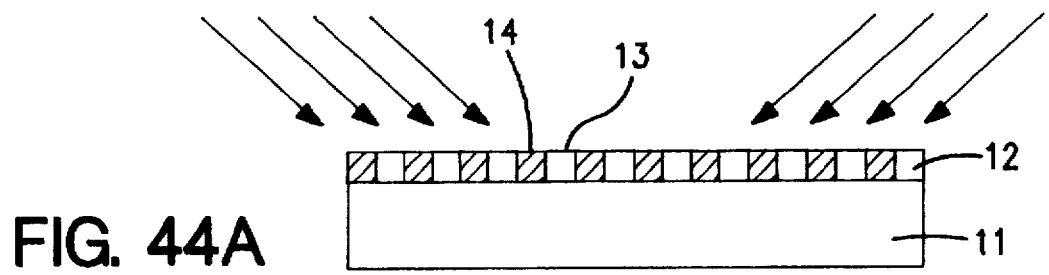
Figure 44B:
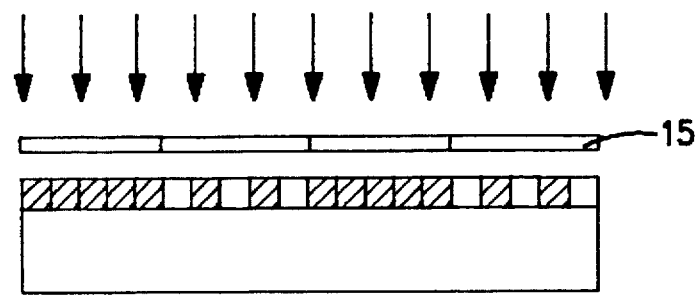
Figure 44C:
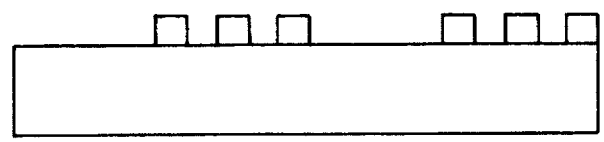
Figure 44D:
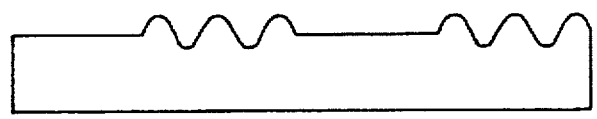
Figure 44E:
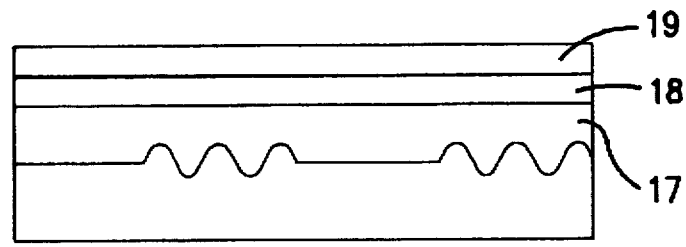

The fabrication process for the above distributed fed back laser will be described with reference to 44A through 44E. A photo-resist film 12 is applied on an n-InP substrate 11. The photo-resist film 12 is exposed to the two-luminous interference exposure so as to form a grating pattern of a period of 2025 angstroms on the photo-resist film 12 as illustrated in FIG. 44A. A mask pattern 15 is provided over the photo-resist film 12 as illustrated in FIG. 44B. The photo-resist film 12 is then subjected to a contact exposure by using the mask pattern 15 to form a grating pattern on the surface of the n-InP substrate 11 as illustrated in FIG. 44C. The n-InP substrate 11 covered by the grating pattern is then subjected to a development to form a grating 16 selectively formed on the n-InP substrate 11 as illustrated in FIG. 44D. The grating has an amplitude of 300 angstroms and a length of 70 micrometers, In this process, a cleavage pattern is formed at end portions of the wafer.

An n-InGaAsP optical guide layer 17 of a wavelength component of 1.13 micrometers is formed by a molecular beam epitaxy on the surface of the substrate 11 on which the grating 1 is selectively formed. The n-InGaAsP optical guide layer 17 has a thickness of 1000 angstroms. A multiple quantum well active layer 18 is formed by a molecular beam epitaxy on the n-InGaAsP optical guide layer 17. The multiple quantum well active layer 18 comprises 10 periods of laminations of quantum well layers and potential barrier layers. The quantum well layer has a wavelength composition of 1.4 micrometers and a thickness of 62 angstroms. The potential barrier layer has a wavelength composition of 1.05 micrometers and a thickness of 100 angstroms. The 10 periods of laminations of quantum well layers and potential barrier layers is sandwiched between first and second SCH layers of a wavelength composition of 1.05 micrometers. The first SCH layer is positioned in the p-side and having a thickness of 600 angstroms. The second SCH layer is positioned in the n-side and having a thickness of 300 angstroms. A p-InP cladding layer 19 having a thickness of about 0.5 micrometers is formed by a molecular beam epitaxy on the multiple quantum well active layer 18. After the p-InP cladding layer 19 is formed, the amplitude of the grating is reduced to 230–240 angstroms. A first facet has a first reflectivity of 1%. A second facet has a second reflectivity of 90%.

A second embodiment according to the present invention will be described with reference to FIG. 45. A distributed feed back laser is provided, which has a cavity length of 300 micrometers. The distributed feed back laser has a first facet 22 of a first reflectivity of 1% and a second facet 23 of a second reflectivity of 90%. A grating 21 is selectively formed on a surface of an n-InP substrate. The grating 21 has a length of 100 micrometers and an amplitude in the range of 230–240 angstroms. The grating 21 has a coupling coefficient of 70 $cm^{-1}$.

An n-InGaAsP optical guide layer 25 of a wavelength component of 1.10 micrometers is formed on the surface of the substrate having the grating 21. A multiple quantum well active layer 24 is formed on the n-InGaAsP optical guide layer 5. The multiple quantum well active layer 24 comprises 7 periods of laminations of quantum well layers and potential barrier layers. The quantum well layer has a wavelength composition of 1.4 micrometers and a thickness of 62 angstroms. The potential barrier layer has a wavelength composition of 1.05 micrometers and a thickness of 50 angstroms. The 7 periods of laminations of quantum well layers and potential barrier layers is sandwiched between first and second SCH layers of a wavelength composition of 1.05 micrometers. The first SCH layer is positioned in the p-side and having a thickness of 600 angstroms. The second SCH layer is positioned in the n-side and having a thickness of 300 angstroms. A p-InP cladding layer having a thickness of about 0.5 micrometers is formed on the multiple quantum well active layer 24.

The distributed feed back laser is tested. The composite second order distortion and the composite triple beat distortion were measured by signals to be used for 80-channel CATV. Under the optical output of 5 mW from an optical fiber and 3.5% modulation per channel, the measured composite second order distortion and the composite triple beat distortion were −64 dBc and −72 dBc respectively. The yield of the above laser was 20% under the condition that the composite second order distortion and the composite triple beat distortion are equal to or less than −60 dBc and −70 dBc respectively. By contrast, for the conventional laser, the measured composite second order distortion and the composite triple beat distortion were −56 dBc and −66 dBc respectively. The yield of the conventional laser was 6% under the condition that the composite second order distortion and the composite triple beat distortion are equal to or less than −60 dBc and −70 dBc respectively.

A third embodiment according to the present invention will be described with reference to FIG. 46. A distributed feed back laser is provided, which has a cavity length of 300 micrometers. The distributed feed back laser has a first facet 32 of a first reflectivity of 1% and a second facet 33 of a second reflectivity of 90%. A grating 31 is selectively formed on a surface of an n-hip substrate. The grating 31 has a length of 70 micrometers and an amplitude of 250 angstroms. The grating 31 has a coupling coefficient of 70 cm$^{-1}$.

An n-InGaAsP optical guide layer 35 of a wavelength component of 1.05 micrometers is formed on the surface of the substrate having the grating 21. A multiple quantum well active layer 34 is formed on the n-InGaAsP optical guide layer 5. The multiple quantum well active layer 34 comprises 7 periods of laminations of quantum well layers and potential barrier layers. The quantum well layer has a wavelength composition of 1.4 micrometers and a thickness of 62 angstroms. The potential barrier layer has a wavelength composition of 1.05 micrometers and a thickness of 50 angstroms. The 7 periods of laminations of quantum well layers and potential barrier layers is sandwiched between first and second SCH layers of a wavelength composition of 1.05 micrometers. The first SCH layer is positioned in the p-side and having a thickness of 600 angstroms. The second SCH layer is positioned in the n-side and having a thickness of 300 angstroms. A p-InP cladding layer having a thickness of about 0.5 micrometers is formed on the multiple quantum well active layer 34.

The distributed feed back laser is tested. The composite second order distortion and the composite triple beat distortion were measured by signals to be used for 80-channel CATV. Under the optical output of 5 mW from an optical fiber and 3.5% modulation per channel, the measured composite second order distortion and the composite triple beat distortion were −62 dBc and −72 dBc respectively. The yield of the above laser was 25% under the condition that the composite second order distortion and the composite triple beat distortion are equal to or less than −60 dBc and −70 dBc respectively. By contrast, for the conventional laser, the measured composite second order distortion and the composite triple beat distortion were −56 dBc and −66 dBc respectively. The yield of the conventional laser was 6% under the condition that the composite second order distortion and the composite triple beat distortion are equal to or less than −60 dBc and −70 dBc respectively.

A fourth embodiment according to the present invention will be described with reference to FIGS. 47 and 48A through 48E. A distributed feed back laser is provided, which has a cavity length of 300 micrometers. The distributed feed back laser has a first facet 52 of a first reflectivity of 1% and a second facet 53 of a second reflectivity of 75%.

A multiple quantum well active layer 54 is formed on an n-InP substrate 51. The multiple quantum well active layer 54 comprises 10 periods of laminations of quantum well layers and potential barrier layers. The quantum well layer has a wavelength composition of 1.4 micrometers and a thickness of 62 angstroms. The potential barrier layer has a wavelength composition of 1.05 micrometers and a thickness of 100 angstroms. The 10 periods of laminations of quantum well layers and potential barrier layers is sandwiched between first and second SCH layers of a wavelength composition of 1.05 micrometers. The first SCH layer is positioned in the p-side and having a thickness of 600 angstroms. The second SCH layer is positioned in the n-side and having a thickness of 300 angstroms. An n-InGaAsP optical guide layer 55 of a wavelength component of 1.05 micrometers is formed on the multiple quantum well active layer 54. A grating 51 is selectively formed on a surface of the n-InGaAsP optical guide layer 55. The grating 1 has a length of 70 micrometers and an amplitude in the range of 280 angstroms. The grating 51 has a coupling coefficient of 70 cm$^{-1}$. A p-InP cladding, layer having a thickness of about 0.5 micrometers is formed on the n-InGaAsP optical guide layer 55.

The distributed feed back laser is tested. The third intermodulation distortion was measured by two signals in the frequency band of 1.5 GHz. Under the optical output of 5 mW from an optical fiber and 20% modulation, the measured third intermodulation distortion was −83 dBc. The yield of the above above laser was 41% under the condition that the third intermodulation distortion is equal to or less than −80 dBc. By contrast, the conventional laser exhibited the third intermodulation distortion of −81 dBc. The yield of the conventional laser was 30% under the condition that the third intermodulation distortion is equal to or less than −80 dBc.

Figure 48A:
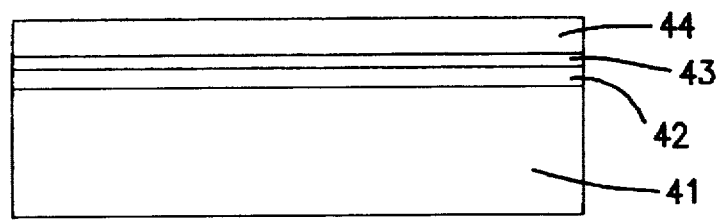

The fabrication process for the above distributed fed back laser will be described with reference to 48A through 48E. A p-InP layer 42 is formed on a p-InP substrate. An active layer is formed on the p-InP layer 42. An n-InGaAsP optical guide layer 44 of a wavelength composition of 1.05 micrometers is formed on the active layer 44 as illustrated in FIG. 48A.

Figure 48B:
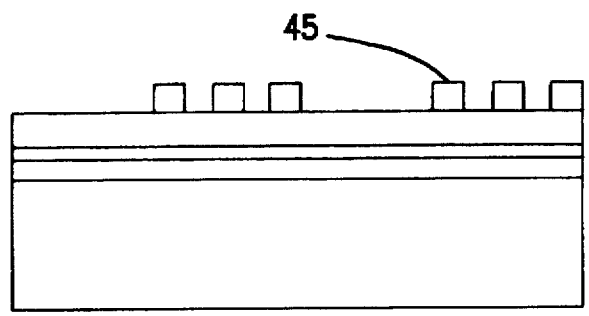
Figure 48C:
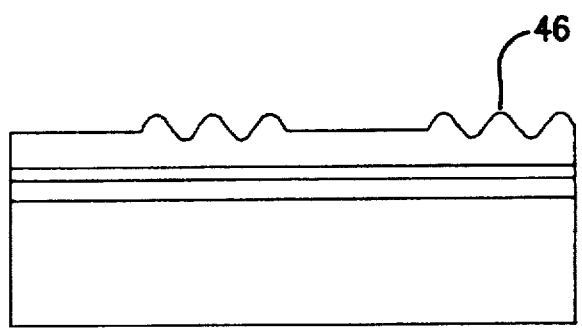
Figure 48D:
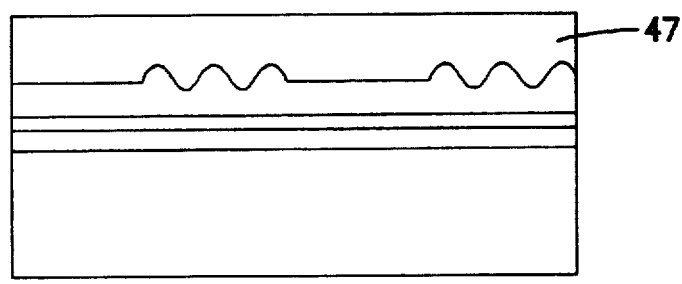

A photo-resist film 45 is applied on the n-InGaAsP optical guide layer 44. The photo-resist film 45 is exposed to the two-luminous interference exposure so as to form a grating pattern of a period of 2025 angstroms on the photo-resist film 45. A mask pattern is provided over the photo-resist film 45. The photo-resist film 45 is then subjected to a contact exposure by using the mark pattern to form a grating pattern on the surface of the n-InGaAsP optical guide layer 44 as illustrated in FIG. 48B. The n-InGaAsP optical guide layer 44 covered by the grating pattern is then subjected to a development to form a grating 46 selectively on the n-InGaAsP optical guide layer 44 as illustrated in FIG. 44C. In this process, a cleavage pattern is formed at end portions of the wafer. An n-InP cladding layer 47 is formed by a metal organic vapor phase epitaxy on the surface of n-InGaAsP optical guide layer 44.

A fifth embodiment according to the present invention will be described with reference to FIG. 49. A distributed feed back laser is provided, which has a cavity length of 600 micrometers. The distributed feed back laser bas a first facet 62 of a first reflectivity of 1% and a second facet 63 of a second reflectivity of 75%. A grating 31 is selectively formed on a surface of an n-InP substrate. The grating 61 has a length of 200 micrometers and an amplitude of 230 angstroms. The grating 31 has a coupling coefficient of 25 $cm^{-1}$.

An n-InGaAsP optical guide layer 65 of a wavelength component of 1.05 micrometers is formed on the surface of the substrate having the grating 21. A multiple quantum well active layer 34 is formed on the n-InGaAsP optical guide layer 5. The multiple quantum well active layer 64 comprises laminations of quantum well layers and potential barrier layers. A p-InP cladding layer having a thickness of about 0.5 micrometers is formed on the multiple quantum well active layer 64.

The distributed feed back laser is tested. The composite second order distortion was measured by signals to be used for 80-channel CATV. Under the optical output of 5 mW from an optical fiber and 3.5% modulation per channel, the measured composite second order distortion was −62 dBc. The yield of the above laser was 25% under the condition that the composite second order distortion is equal to or less than −60 dBc. By contrast, for the conventional laser, the yield was 6% under the condition that the composite second order distortion is equal to or less than −60 dBc.

A sixth embodiment according to the present invention will be described with reference to FIGS. 50 and 51A through 51E. A distributed feed back laser is provided, which has a cavity length of 300 micrometers. The distributed feed back laser has a first facet 5 of a first reflectivity of 1% and a second facet 6 of a second reflectivity of 75%. A grating 7 is entirely formed on a surface of an n-YnP substrate. The grating 7 comprises a first grating 7a and a second grating 7b. The first grating, 7a is formed in a half area of the substrate near the first facet 5. The second grating 7b is formed in a half area of the substrate near the second facet 6. The first grating 7a has a length of 150 micrometers and an amplitude of 220 angstroms. The second grating 7b has a length of 150 micrometers and an amplitude of 100 angstroms. The coupling coefficient of the first grating 7a is larger than the coupling coefficient of the second grating 7b.

An n-InGaAsP optical guide layer 2 having a thickness of 10 micrometers is formed on the surface of the substrate 1 having the grating 16. A multiple quantum well active layer 3 is formed on the n-InGaAsP optical guide layer 2. A p-InP cladding layer 4 is formed on the multiple quantum well active layer 3 having a thickness of 0.5 micrometers.

The distributed feed back laser is tested. The yield of the above laser was 25% under the condition that the third intermodulation distortion is equal to or less than −80 dBc. The measured sub-mode suppressing ratio was 40 dB or more. By contrast, for the conventional laser, the yield was 12% under the condition that the third intermodulation distortion is equal to or less than −80 dBc. The measured sub-mode suppressing ratio was 35 dB or more.

Figure 51A:
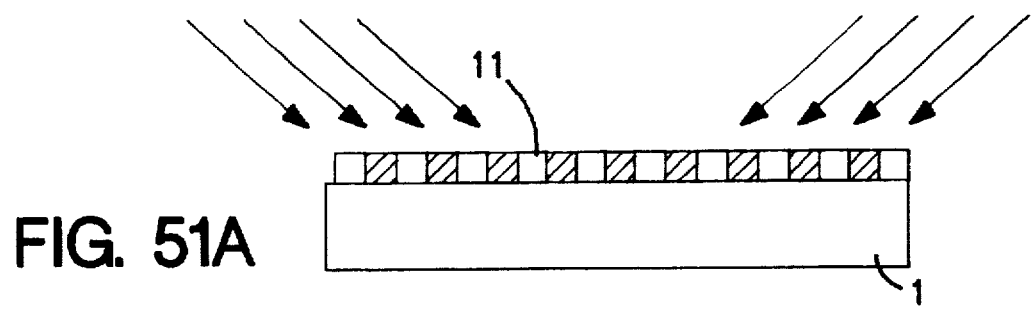
Figure 51B:
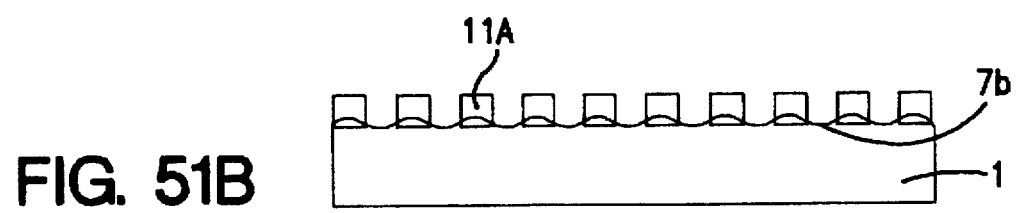
Figure 51C:
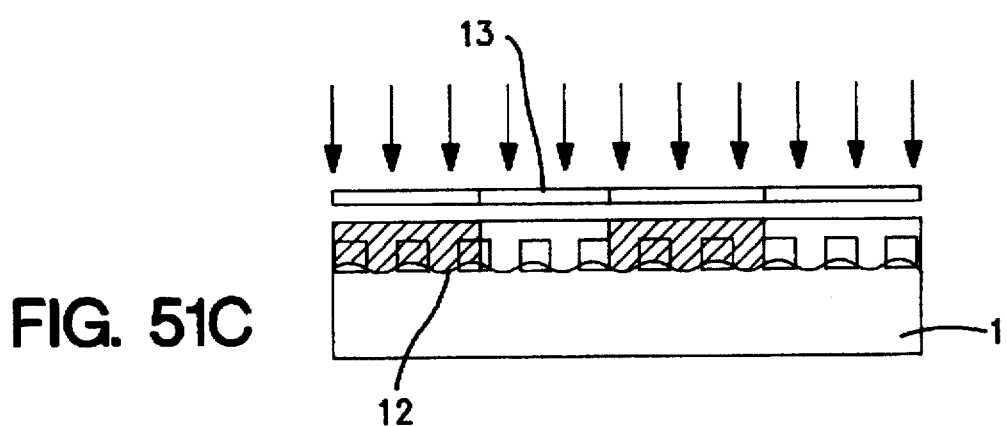
Figure 51D:
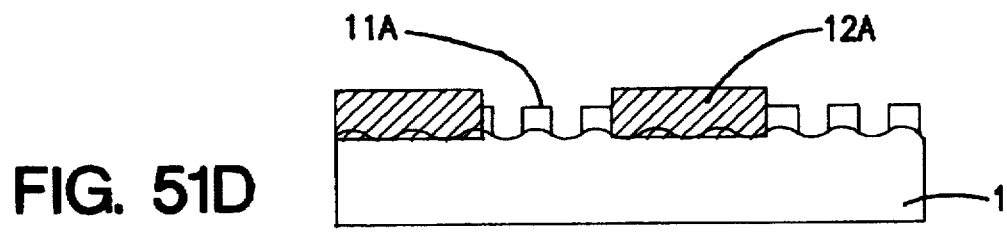
Figure 51E:
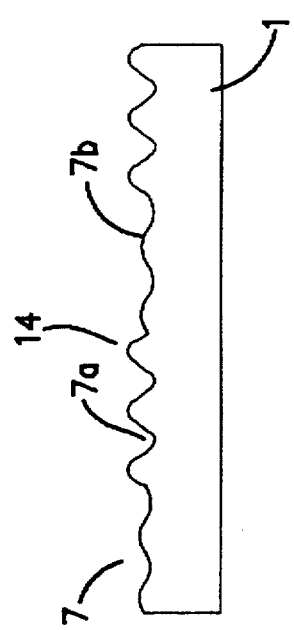

The fabrication process for the above distributed fed back laser will be described with reference to 51A through 51E. A negative photo-resist film is applied on an n-InP substrate 1 as illustrated in FIG. 51B. The photo-resist film is exposed to the two-luminous interference exposure so as to form a grating pattern 11A of a period of 2025 angstroms as illustrated in FIG. 51B. A positive photo resist 12 is applied on the grating pattern 11A. By use of the grating pattern 11A the surface of the substrate 1 is etched to form a second grating 7b. A mask pattern 13 is provided over the positive photo resist 12 as illustrated in FIG. 51C. The photo-resist film is then subjected to a contact exposure and subsequent development to form a photo-resist pattern 14 comprising the negative and positive photo-resist films 11 and 12 as illustrated in FIG. 51D. The n-InP substrate 11 covered by the photo-resist pattern 14 is then etched to form a first grating 7a as illustrated in FIG. 51E.

A seventh embodiment of the present invention is illustrated in FIG. 52. Similar to the first embodiment, a semiconductor substrate 101 of InP material is overlaid with an optical guide layer 102 of InGaAsP material. An active layer 103 is provided over optical guide layer 102. A grating structure 104 is positioned intermediate substrate 101 and optical guide layer 102. As shown, the grating structure has a grating length of no more than one third of the cavity length between the first facet 105 and the second facet 106. The grating structure 104 preferably has an integrated coupling coefficient within the range of 0.4–0.6.

In departure from the first embodiment, an additional optical layer 107 is positioned over active layer 103. An InP cladding layer 108 extends over additional optical layer 107. A second grating structure 109 is placed intermediate the additional optical layer 107 and the InP cladding layer 108. Second grating structure preferably has a grating length of one third of the cavity length between the first facet 105 and the second facet 106. The grating structure 109 preferably has an integrated coupling coefficient within the range of 0.4–0.6.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover y claims all modifications which fall within the spirit and scope of the present invention.

What is claimed is:

1. A grating structure partially provided in a semiconductor laser device having a first facet of a first reflectivity and a second facet of a second reflectivity being larger than said first reflectivity, said grating structure extending within a half area near said first facet, wherein said grating structure has a grating length in a cavity direction of not more than one third of a cavity length defined as a distance between said first and second facets, wherein said grating structure has an integrated coupling coefficient value in the range of 0.4–0.6, said integrated coupling coefficient value being obtained by integrating coupling coefficient of said grating structure with positions in said cavity direction, wherein said grating structure comprises a single grating which continuously extends from said first facet toward a center of said semiconductor laser device, wherein said single grating has amplitudes which are continuously varied over positions over positions in said cavity direction, wherein said amplitudes are linearly varied over positions in said cavity direction, and are proportionally decreased toward said first facet.

2. A grating structure partially provided in a semiconductor laser device having a first facet of a first reflectivity and a second facet of a second reflectivity being larger than said first reflectivity, said grating structure extending within a half area near said first facet, wherein said grating structure has a grating length in a cavity direction of not more than one third of a cavity length defined as a distance between said first and second facets, wherein said grating structure has an integrated coupling coefficient value in the range of 0.4–0.6, said integrated coupling coefficient value being obtained by integrating coupling coefficient of said grating structure with positions in said cavity direction, wherein said grating structure comprises a single grating which continuously extends from said first facet toward a center of said semiconductor laser device, wherein said single grating has amplitudes which are continuously varied over positions in said cavity direction, and said amplitudes are non-linearly varied over positions in said cavity direction.

3. A grating structure partially provided in a semiconductor laser device having a first facet of a first reflectivity and a second facet of a second reflectivity being larger than said first reflectivity, said grating structure extending within a half area near said first facet, wherein said grating structure has a grating length in a cavity direction of not more than one third of a cavity length defined as a distance between said first and second facets, wherein said grating structure has an integrated coupling coefficient value in the range of 0.4–0.6, said integrated coupling coefficient value being obtained by integrating coupling coefficient of said grating structure with positions in said cavity direction, wherein said grating structure comprises a single grating which continuously extends from said first facet toward a center of said semiconductor laser device, and said single grating has amplitudes which are discontinuously varied over positions in said cavity direction.

4. The grating structure as claimed in claim 3, wherein said amplitudes comprise a plurality of different amplitudes.

5. The grating structure as claimed in claim 4, wherein said amplitudes comprise a first amplitude and a second amplitude larger than said first amplitude, and wherein said grating has said first amplitude on a first region near said first facet, and said grating has said second amplitude on a second region apart from said first facet.

6. The grating structure as claimed in claim 4, wherein said amplitudes comprise a first amplitude and a second amplitude larger than said first amplitude, and wherein said grating has said second amplitude on a first region near said first facet, and said grating has said first amplitude on a second region apart from said first facet.

7. A grating structure partially provided in a semiconductor laser device having a first facet of a first reflectivity and a second facet of a second reflectivity being larger than said first reflectivity, said grating structure extending within a half area near said first facet, wherein said grating structure has a grating length in a cavity direction of not more than one third of a cavity length defined as a distance between said first and second facets, wherein said grating structure has an integrated coupling coefficient value in the range of 0.4–0.6, said integrated coupling coefficient value being obtained by integrating coupling coefficient of said grating structure with positions in said cavity direction, wherein said grating structure comprises a single grating which is distanced from said first facet and continuously extends toward a center of said semiconductor laser device, wherein said single grating has amplitudes which are continuously varied over positions in said cavity direction, wherein said amplitudes are linearly varied over positions in said cavity direction, and said amplitudes are proportionally decreased toward said first facet.

8. A grating structure partially provided in a semiconductor laser device having a first facet of a first reflectivity and a second facet of a second reflectivity being larger than said first reflectivity, said grating structure extending within a half area near said first facet, wherein said grating structure has a grating length in a cavity direction of not more than one third of a cavity length defined as a distance between s aid first and second facets, wherein said grating structure has an integrated coupling coefficient value in the range of 0.4–0.6, said integrated coupling coefficient value being obtained by integrating coupling coefficient of said grating structure with positions in said cavity direction, wherein said grating structure comprises a single grating which is distanced from said first facet and continuously extends toward a center of said semiconductor laser device, wherein said single grating has amplitudes which are continuously varied over positions in said cavity direction, and said amplitudes are non-linearly varied over positions in said cavity direction.

9. A grating structure partially provided in a semiconductor laser device having a first facet of a first reflectivity and a second facet of a second reflectivity being larger than said first reflectivity, said grating structure extending within a half area near said first facet, wherein said grating structure has a grating length in a cavity direction of not more than one third of a cavity length defined as a distance between said first and second facets, wherein said grating structure has an integrated coupling coefficient value in the range of 0.4–0.6, said integrated coupling coefficient value being obtained by integrating coupling coefficient of said grating structure with positions in said cavity direction, wherein said grating structure comprises a single grating which is distanced from said first facet and continuously extends toward a center of said semiconductor laser device, and said single grating has amplitudes which are discontinuously varied over positions in said cavity direction.

10. The grating structure as claimed in claim 9, wherein said amplitudes comprise a plurality of different amplitudes.

11. The grating structure as claimed in claim 10, wherein said amplitudes comprise a first amplitude and a second amplitude larger than said first amplitude, and wherein said grating has said first amplitude on a first region near said first facet, and said grating has said second amplitude on a second region apart from said first facet.

12. The grating structure as claimed in claim 10, wherein said amplitudes comprise a first amplitude and a second amplitude larger than said first amplitude, and wherein said grating has said second amplitude on a first region near said first facet, and said grating has said first amplitude on a second region apart from said first facet.

13. A grating structure partially provided in a semiconductor laser device having a first facet of a first reflectivity and a second facet of a second reflectivity being larger than said first reflectivity, said grating structure extending within a half area near said first facet, wherein said grating structure has a grating length in a cavity direction of not more than one third of a cavity length defined as a distance between said first and second facets, wherein said grating structure has an integrated coupling coefficient value in the range of 0.4–0.6, said integrated coupling coefficient value being obtained by integrating coupling coefficient of said grating structure with positions in said cavity direction, wherein said grating structure comprises a plurality of gratings which discontinuously extend from said first facet toward a center of said semiconductor laser device, and said grating structure further comprises a first grating which continuously extends from said first facet, and a second grating which is distanced from said first grating and continuously extends toward a center of said semiconductor laser device.

14. A grating structure partially provided in a semiconductor laser device having a first facet of a first reflectivity and a second facet of a second reflectivity being larger than said first reflectivity, said grating structure extending within a half area near said first facet, wherein said grating structure has a grating length in a cavity direction of not more than one third of a cavity length defined as a distance between said first and second facets, wherein said grating structure has an integrated coupling coefficient value in the range of 0.4–0.6, said integrated coupling coefficient value being obtained by integrating coupling coefficient of said grating structure with positions in said cavity direction, wherein said grating structure comprises a plurality of gratings which discontinuously extend from said first facet toward a center of said semiconductor laser device, and any of said plurality of gratings has amplitudes which are continuously varied over positions in said cavity direction.

15. The grating structure as claimed in claim 14, wherein said amplitudes are linearly varied over positions in said cavity direction.

16. The grating structure as claimed in claim 15, wherein said amplitudes are proportionally increased toward said first facet.

17. The grating structure as claimed in claim 15, wherein said amplitudes are proportionally decreased toward said first facet.

18. The gating structure as claimed in claim 14, wherein said amplitudes are non-linearly varied over positions in said cavity direction.

19. A grating structure partially provided in a semiconductor laser device having a first facet of a first reflectivity and a second facet of a second reflectivity being larger than said first reflectivity, said grating structure extending within a half area near said first facet, wherein said grating structure has a grating length in a cavity direction of not more than one third of a cavity length defined as a distance between said first and second facets, wherein said grating structure has an integrated coupling coefficient value in the range of 0.4–0.6, said integrated coupling coefficient value being obtained by integrating coupling coefficient of said grating structure with positions in said cavity direction, wherein said grating structure comprises a plurality of gratings which discontinuously extend from said first facet toward a center of said semiconductor laser device, and any of said plurality of gratings has amplitudes which are discontinuously varied over positions in said cavity direction.

20. The grating structure as claimed in claim 19, wherein said amplitudes comprise a plurality of different amplitudes.

21. A grating structure partially provided in a semiconductor laser device having a first facet of a first reflectivity and a second facet of a second reflectivity being larger than said first reflectivity, said grating structure extending within a half area near said first facet, wherein said grating structure has a grating length in a cavity direction of not more than one third of a cavity length defined as a distance between said first and second facets, wherein said grating structure has an integrated coupling coefficient value in the range of 0.4–0.6, said integrated coupling coefficient value being obtained by integrating coupling coefficient of said grating structure with positions in said cavity direction, wherein said grating structure comprises a plurality of gratings which are distanced from said first facet and discontinuously extend toward a center of said semiconductor laser device, and said grating structure further comprises a first grating which is distanced from said first facet and, a second grating which is distanced from said first grating and continuously extends toward a center of said semiconductor laser device.

22. A grating structure partially provided in a semiconductor laser device having a first facet of a first reflectivity and a second facet of a second reflectivity being larger than said first reflectivity, said grating structure extending within a half area near said first facet, wherein said grating structure has a grating length in a cavity direction of not more than one third of a cavity length defined as a distance between said first and second facets, wherein said grating structure has an integrated coupling coefficient value in the range of 0.4–0.6, said integrated coupling coefficient value being obtained by integrating coupling coefficient of said grating structure with positions in said cavity direction, wherein said grating structure comprises a plurality of gratings which are distanced from said first facet and discontinuously extend toward a center of said semiconductor laser device, and any of said plurality of gratings has amplitudes which are continuously varied over positions in said cavity direction.

23. The grating structure as claimed in claim 22, wherein said amplitudes are linearly varied over positions in said cavity direction.

24. The grating structure as claimed in claim 23, wherein said amplitudes are proportionally increased toward said first facet.

25. The grating structure as claimed in claim 23, wherein said amplitudes are proportionally decreased toward said first facet.

26. The grating structure as claimed in claim 22, wherein said amplitudes are non-linearly varied over positions in said cavity direction.

27. A grating structure partially provided in a semiconductor laser device having a first facet of a first reflectivity and a second facet of a second reflectivity being larger than said first reflectivity, said grating structure extending within a half area near said first facet, wherein said grating structure has a grating length in a cavity direction of not more than one third of a cavity length defined as a distance between said first and second facets, wherein said grating structure has an integrated coupling coefficient value in the range of 0.4–0.6, said integrated coupling coefficient value being obtained by integrating coupling coefficient of said grating structure with positions in said cavity direction, wherein said grating structure comprises a plurality of gratings which are distanced from said first facet and discontinuously extend toward a center of said semiconductor laser device, and any of said plurality of gratings has amplitudes which are discontinuously varied over positions in said cavity direction.

28. The grating structure as claimed in claim 27, wherein said amplitudes comprise a plurality of different amplitudes.

29. A grating structure partially provided in a semiconductor laser device having a first facet of a first reflectivity and a second facet of a second reflectivity being larger than said first reflectivity, said grating structure extending within a half area near said first facet, wherein said grating structure has a grating length in a cavity direction of not more than one third of a cavity length defined as a distance between said first and second facets, wherein said grating structure has an integrated coupling coefficient value in the range of 0.4–0.6, said integrated coupling coefficient value being obtained by integrating coupling coefficient of said grating structure with positions in said cavity direction, wherein said grating structure is provided on an interface between an InP layer and an InGaAsP optical guide layer, and wherein said grating structure has an averaged amplitude value in the range of 200 to 260 angstroms, said averaged amplitude value being obtained by dividing an integrated value by said grating length, said integrated value being obtained by integrating amplitude of said grating structure with positions in said cavity direction; and wherein said InGaAsP optical guide layer has a constant energy band gap corresponding to a wavelength composition of less than 1.10 micrometers, and wherein said grating structure has an averaged amplitude value not less than 260 angstroms, said averaged amplitude value being obtained by dividing an integrated value by said grating length, said integrated value being obtained by integrating amplitude of said grating structure with positions in said cavity direction.

30. A semiconductor laser device having a first facet of a first reflectivity and a second facet of a second reflectivity being larger than said first reflectivity, said laser device comprising:

a semiconductor substrate being made of InP;

an optical guide layer being provided on said semiconductor substrate, said optical guide layer being made of InGaAsP;

an active layer being provided on said optical guide layer; and a grating structure being partially provided on an interface between said semiconductor substrate and said optical guide layer, said grating structure extending within a half area near said first facet, wherein said grating structure has a grating length in a cavity direction of not more than one third of a cavity length defined as a distance between said first and second facets, wherein said grating structure has an integrated coupling coefficient value in the range of 0.4–0.6, said integrated coupling coefficient value being obtained by integrating coupling coefficient of said grating structure with positions in said cavity direction;

an additional optical guide layer extending over said active layer;

an InP cladding layer extending over said additional optical guide layer; and an additional grating structure being partially provided on an interface between said InP cladding layer and said additional optical guide layer, said additional grating structure extending within a second half area near said first facet, wherein said additional grating structure has a grating length in said cavity direction of not more than one third of said cavity length, and wherein said additional grating structure has an integrated coupling coefficient value in the range of 0.4–0.6, said integrated coupling coefficient value being obtained by integrating coupling coefficient of said additional grating structure with positions in said cavity direction.

* * * * *